United States Patent
Lafontaine et al.

(10) Patent No.: US 9,746,506 B2
(45) Date of Patent: *Aug. 29, 2017

(54) NONLINEAR SYSTEM IDENTIFICATION FOR OPTIMIZATION OF WIRELESS POWER TRANSFER

(71) Applicant: Nucleus Scientific Inc., Lincoln, MA (US)

(72) Inventors: Serge R. Lafontaine, Lincoln, MA (US); Ian W. Hunter, Lincoln, MA (US)

(73) Assignee: Nucleus Scientific Inc., Cambridge, MA (US)

( * ) Notice: Subject to any disclaimer, the term of this patent is extended or adjusted under 35 U.S.C. 154(b) by 749 days.

This patent is subject to a terminal disclaimer.

(21) Appl. No.: 14/107,220

(22) Filed: Dec. 16, 2013

(65) Prior Publication Data

US 2014/0172338 A1    Jun. 19, 2014

Related U.S. Application Data

(60) Provisional application No. 61/738,786, filed on Dec. 18, 2012.

(51) Int. Cl.
   *G01R 25/00* (2006.01)
   *G01R 27/00* (2006.01)
   (Continued)

(52) U.S. Cl.
   CPC ......... *G01R 23/02* (2013.01); *G01R 19/2509* (2013.01); *G01R 25/00* (2013.01);
   (Continued)

(58) Field of Classification Search
   CPC .... G01R 23/02; G01R 19/2509; G01R 19/00; G01R 31/001; G01R 25/00; H02J 5/005;
   (Continued)

(56) References Cited

U.S. PATENT DOCUMENTS 6,822,601 B1 * 11/2004 Liu ............... H03M 1/1004
                                                    341/120
7,035,756 B2 * 4/2006 Maloberti .......... H03M 1/1004
                                                    341/118
(Continued)

FOREIGN PATENT DOCUMENTS

CN        102612796       7/2012

OTHER PUBLICATIONS

Oliver Nelles, "Nonlinear System Identification" 2001, Spring-Verlag Berlin Heidelberg, pp. 582-586.*

(Continued)

*Primary Examiner* — David M Gray
*Assistant Examiner* — Geoffrey T Evans
(74) *Attorney, Agent, or Firm* — Occhiuti & Rohlicek LLP

(57) ABSTRACT

A method of detecting whether a receiver coil is near a transmit coil in a wireless power transfer system (WPTS), the method involving: applying a pseudo-random signal to the transmit coil; while the pseudo-random signal is being applied to the transmit coil, recording one or more signals produced within the WPTS in response to the applied pseudo-random signal; by using the one or more recorded signals, generating a dynamic system model for some aspect of the WPTS; and using the generated dynamic system model in combination with stored training data to determine whether an object having characteristics distinguishing the object as a receiver coil is near the transmit coil.

35 Claims, 17 Drawing Sheets

(51) Int. Cl.
    *G01R 23/02*    (2006.01)
    *G01R 31/00*    (2006.01)
    *H02J 7/02*    (2016.01)
    *H02J 5/00*    (2016.01)
    *H02J 17/00*    (2006.01)
    *G01R 19/25*    (2006.01)
    *H02J 50/90*    (2016.01)

(52) U.S. Cl.
    CPC ............ *G01R 31/001* (2013.01); *H02J 5/005* (2013.01); *H02J 7/025* (2013.01); *H02J 17/00* (2013.01); *H02J 50/90* (2016.02)

(58) Field of Classification Search
    CPC .... H02J 7/025; H02J 7/00; H02J 50/90; H02J 17/00
    USPC .......................................................... 702/65
    See application file for complete search history.

(56) References Cited

U.S. PATENT DOCUMENTS

| | | | |
|---|---|---|---|
| 7,075,893 B1 * | 7/2006 | Mlinarsky | H04L 12/2697 370/241 |
| 7,525,283 B2 | 4/2009 | Cheng et al. | |
| 8,487,792 B2 * | 7/2013 | Erdmann | H03M 1/0641 341/118 |
| 8,547,057 B2 | 10/2013 | Dunworth et al. | |
| 9,118,357 B2 | 8/2015 | Tseng | |
| 9,300,163 B2 | 3/2016 | Cern | |
| 2007/0222426 A1 | 9/2007 | Waffenschmidt | |
| 2010/0084918 A1 | 4/2010 | Fells et al. | |
| 2010/0187913 A1 | 7/2010 | Smith et al. | |
| 2012/0002446 A1 | 1/2012 | Madawala et al. | |
| 2012/0098481 A1 * | 4/2012 | Hunter | H02J 7/0072 320/106 |
| 2012/0235506 A1 | 9/2012 | Kallal et al. | |
| 2012/0242160 A1 | 9/2012 | Tseng | |
| 2012/0267960 A1 | 10/2012 | Low et al. | |
| 2013/0043735 A1 | 2/2013 | Low et al. | |
| 2013/0062959 A1 | 3/2013 | Lee et al. | |
| 2013/0099807 A1 | 4/2013 | Wheeland et al. | |
| 2013/0221911 A1 | 8/2013 | Low et al. | |
| 2014/0167704 A1 * | 6/2014 | Lafontaine | G01R 25/00 320/137 |
| 2014/0241555 A1 | 8/2014 | Terlizzi | |
| 2014/0266035 A1 | 9/2014 | Cern | |

OTHER PUBLICATIONS

Wyatt, "Nonlinear Dynamic Maximum Power Theorem," RLE Technical Report No. 525, Mar. 1987, all pages.

* cited by examiner

A - Two Coils   B - Two Coils 8 Ohms   C - One Coils

NONLINEAR SYSTEM IDENTIFICATION FOR OPTIMIZATION OF WIRELESS POWER TRANSFER

This application claims the benefit of U.S. Provisional Application No. 61/738,786, filed Dec. 18, 2012, all of which is incorporated herein by reference.

TECHNICAL FIELD

Embodiments of the present invention generally relate to wireless power transfer for charging and/or powering systems such as might be found in, but without limitation, electric vehicles and portable devices.

BACKGROUND OF THE INVENTION

With the renewed interest in electric cars we have seen a number of new developments in battery technology, fast charging techniques and wireless power transmission as a convenient method to recharge batteries. Wireless fast charging techniques become even more relevant for pure electric cars as a method to alleviate the limited range provided by current battery technology. In this way batteries could be recharged either while driving from coils embedded in the roads, at traffic lights, in parking lots while shopping or at drive-ins.

Wireless power transfer has a long history starting probably with Tesla. The technology is now used everywhere, from toothbrushes, cell phones, notebooks and is even considered for general use in houses such as lamps, clocks, etc. In most applications wireless power transfer is used for charging batteries, which is used as a temporary energy reservoir between the wireless charging system and the device. With the advent of better battery technologies, such as lithium-ion cells, it becomes feasible to charge batteries much more rapidly than before and to do so with wireless fast chargers. To achieve general acceptance, these wireless fast chargers need to be efficient and robust, which is the focus of some of the applications discussed in this document.

There are many types of wireless power transfer. This disclosure focuses on Resonant Induction Charging (RIC), although much of what is described also applies to other types of wireless charging methods. RIC, as the name implies, uses high-Q tuned coils and capacitors, and power is transmitted from coil to coil through magnetic fields. RIC differs from far-field techniques involving, for example, very high frequency RF fields, which require sophisticated electronics, and near-field techniques, which only work within a fraction of a wavelength when using RIC. With RIC, it is found that significantly more power can be transferred between coils and up to a distance exceeding several coil diameters. Using a magnetic field rather than a radiating electromagnetic field also presents fewer potential health hazards.

A common type of coil used for RIC is a pancake coil with a single spiral winding arrayed in a plane. The circuit diagram in FIG. 1 shows a typical circuit used for RIC, where coils L1 and L2 would be the transmit and receiver coils, respectively, fabricated as pancake coils. As it is the case for transformers, the electrical characteristics of the coils can be described by the coils' resistances, self-inductance, and mutual inductance. The mutual inductance is related to how much of the field generated by one coil traverses the other coil(s), which is largely related to the geometry of how the coils are orientated with respect to each other, including distance and orientation. As the coupling decreases, less of the power is transmitted while the power loss in joule heating remains the same or increases, and hence the efficiency decreases.

SUMMARY OF THE INVENTIONS

In general, in one aspect, at least one of the inventions features a method of detecting whether a receiver coil is near a transmit coil in a wireless power transfer system (WPTS). The method involves: applying a pseudo-random signal to the transmit coil; while the pseudo-random signal is being applied to the transmit coil, recording one or more signals produced within the WPTS in response to the applied pseudo-random signal; by using the one or more recorded signals, generating a dynamic system model for some aspect of the WPTS; and using the generated dynamic system model in combination with stored training data to determine whether an object having characteristics distinguishing the object as a receiver coil is near the transmit coil.

Other embodiments include one or more of the following features. The method also includes, if the receiver coil is determined to be near the transmit coil, initiating a wireless power transfer through the transmit coil to the receiver coil. The pseudo-random signal is a pseudo-random voltage signal and/or is sufficiently strong to stimulate nonlinearities in a receiver system connected to the receiver coil. The one or more signals includes a current signal of the transmit coil and possibly a voltage signal of the transmit coil. Using the generated dynamic system model involves comparing information contained in the generated dynamic system model to empirically-derived, stored information that is indicative of a nearby presence of a receiver coil. Generating the dynamic system model involves using system identification or nonlinear system identification to fit a selected model to data derived from the one or more recorded signals. The selected model is a Wiener system and/or the selected model has a dynamic linear part and a static nonlinear part. The dynamic system model is an impedance function for the transmit coil or a transmitted power function for transmit coil. Using the generated dynamic system model involves decomposing the dynamic system model into basis functions to generate a set of basis function parameters and using the set of basis function parameters to determine whether a receiver coil is near the transmit coil. The pseudo-random signal is a selected one of a Gaussian White Noise signal and a Pseudo-Random Binary Sequence (PRBS). The generated dynamic system model includes a time domain representation or a frequency domain representation.

Still other embodiments include one or more of the following features. The stored training data is represented by a stored filter function and wherein using the generated dynamic system model in combination with stored training data comprises processing the generated dynamic system model to generate an output signal, wherein the output signal indicates whether an object having characteristics recognizable from the stored training data as a receiver coil is near the transmit coil and wherein processing the dynamic system model comprises applying the stored filter function. Generating the dynamic system model involves computing a frequency spectrum from the one or more recorded signals. The generated dynamic system model is an impedance spectrum for the transmit coil. The filter function is a nonlinear filter function. The nonlinear filter function was derived from measurements made on a test system including a test transmit coil and a test receiver coil located at different distances of separation from each other. The method also involves, if a receiver coil is detected near the transmit coil, initiating a wireless power transfer through the transmit coil to the detected receiver coil.

In general, in yet another aspect, at least one invention features a wireless power transfer system. The wireless power transfer system includes: a transmit coil; a power transmitter circuit connected to the transmit coil; a sensor circuit connected to the transmit coil; and a controller for controlling the power transmitter circuit and the sensor circuit, wherein the controller includes a memory for storing training data and a processor system programmed to: cause the power transmitter circuit to apply a pseudo-random signal to the transmit coil; while the pseudo-random signal is being applied to the transmit coil, cause the sensor circuit to record one or more signals produced the within the WPTS in response to the applied pseudo-random signal; by using the one or more recorded signals, generate a dynamic system model for some aspect of the WPTS; and use the generated dynamic system model in combination with the stored training data to determine whether an object having characteristics distinguishing the object as a receiver coil is near the transmit coil.

Other embodiments of the invention include one or more of the following features. The one or more signals includes a current signal and a voltage signal of the transmit coil. The stored training data is represented by a stored filter function and the processor system is programmed to use the generated dynamic system model in combination with stored training data by processing the generated dynamic system model to generate an output signal, wherein the output signal indicates whether an object having characteristics recognizable from the stored training data as a receiver coil is near the transmit coil and the processing of he generated dynamic system model involves applying the filter function. The processor system is programmed to generate the dynamic system model by computing a frequency spectrum from the one or more recorded signals. The generated dynamic system model is an impedance spectrum for the transmit coil.

In general, in still yet another aspect, at least one invention features a method of finding an operating frequency for a drive signal to a transmit coil in a wireless power transfer system (WPTS). The method involves: applying a pseudo-random signal to the transmit coil; while the pseudo-random signal is being applied to the transmit coil, recording one or more signals produced within the WPTS in response to the applied pseudo-random signal; by using the one or more recorded signals, generating a dynamic system model for some aspect of the WPTS; and conducting a search for an optimum frequency for the drive signal, wherein conducting the search comprises repeatedly using the generated dynamic system model to simulate a response to the drive signal while varying the operating frequency of the drive signal until the optimum frequency is found.

Other embodiments include one or more of the following features. Conducting a search involves: computing an output power from the simulated response; using the computed output power as an objective function; and conducting the search by using the objective function. The also involves setting the operating frequency of the drive signal to the optimum frequency. The pseudo-random signal is a pseudo-random voltage signal. The one or more signals includes a current signal of the transmit coil or it includes both a current signal and a voltage signal of the transmit coil. Generating the representation of the transfer function involves using system identification or nonlinear system identification to fit a model to data derived from the one or more recorded signals. The selected model is a Wiener system or it has a dynamic linear part and a static nonlinear part. The generated dynamic system model includes a time domain representation or a frequency domain representation.

In general, in still another aspect, at least one of the inventions features a wireless power transfer system. The wireless power transfer system includes: a transmit coil; a power transmitter circuit connected to the transmit coil; a sensor circuit connected to the transmit coil; and a controller for controlling the power transmitter circuit and the sensor circuit, wherein said controller includes a memory for storing training data and a processor system programmed to: cause the power transmitter to apply a pseudo-random signal to the transmit coil; while the pseudo-random signal is being applied to the transmit coil, cause the sensor circuit to record one or more signals produced within the WPTS in response to the applied pseudo-random signal; by using the one or more recorded signals, generate a dynamic system model for some aspect of the WPTS; and conduct a search for an optimum frequency for the drive signal, wherein conducting the search comprises repeatedly using the generated dynamic system model to simulate a response to the drive signal while varying the operating frequency of the drive signal until the optimum frequency is found.

In general, in another aspect, at least one of the inventions features a method of finding an operating frequency for a drive signal to a transmit coil in a wireless power transfer system (WPTS). The method involves: applying a pseudo-random signal to the transmit coil; while the pseudo-random signal is being applied to the transmit coil, recording a signal produced within the WPTS in response to the applied pseudo-random signal; and processing the recorded signal to generate an output signal, wherein the output signal identifies the operating frequency to be used for the drive signal and wherein processing the recorded signal comprises applying a nonlinear filter function.

Other embodiments include one or more of the following features. The nonlinear filter function was derived from measurements made on a test system including a test transmit coil and a test receiver coil located at different distances of separation from each other. Recording a signal produced within the WPTS in response to the applied pseudo-random signal involves recording a signal produced by the transmit coil.

In general, in yet another aspect, at least one of the inventions features a wireless power transfer system (WPTS). The wireless power transfer system includes: a transmit coil; a power transmitter circuit connected to the transmit coil; a sensor circuit connected to the transmit coil; and a controller for controlling the power transmitter circuit and the sensor circuit, wherein said controller includes a memory for storing a nonlinear filter function and a processor system programmed to: cause the power transmitter to apply a pseudo-random signal to the transmit coil; while the pseudo-random signal is being applied to the transmit coil, cause the sensor circuit to record a signal produced within the WPTS in response to the applied pseudo-random signal; and process the recorded signal to generate an output signal, wherein the output signal identifies the operating frequency to be used for the drive signal and wherein processing the recorded signal involves applying a nonlinear filter function.

Other embodiments include one or more of the following features. The nonlinear filter function was derived from measurements made on a test system including a test transmit coil and a test receiver coil located at different distances of separation from each other. The signal produced within the WPTS in response to the applied pseudo-random signal is a signal produced by the transmit coil.

In general, in still yet another aspect, at least one of the inventions features a method of identifying a waveform for a drive signal to a transmit coil in a wireless power transfer system (WPTS). The method involves: applying a pseudo-random signal to the transmit coil; while the pseudo-random signal is being applied to the transmit coil, recording one or more signals produced within the WPTS in response to the applied pseudo-random signal; by using the one or more recorded signals, generating a dynamic system model for some aspect of the WPTS; and conducting a search for an optimum waveform for the drive signal, wherein conducting the search comprises repeatedly using the generated dynamic system model to simulate a response to the drive signal while varying the waveform of the drive signal until the optimum waveform is found.

Other embodiments include one or more of the following features. Conducting a search further involves: computing an output power from the simulated response; using the computed output power as an objective function; and conducting the search by using the objective function. The one or more signals produced within the WPTS includes a signal produced by the transmit coil in response to the applied pseudo-random signal.

In general, in another aspect, at least one of the inventions features a wireless power transfer system. The wireless power transfer system includes: a transmit coil; a power transmitter circuit connected to the transmit coil; a sensor circuit connected to the transmit coil; a controller for controlling the power transmitter circuit and the sensor circuit, wherein the controller includes a memory for storing a nonlinear filter function and a processor system programmed to: cause the power transmitter to apply a pseudo-random signal to the transmit coil; while the pseudo-random signal is being applied to the transmit coil, cause the sensor circuit to record one or more signals produced within the WPTS in response to the applied pseudo-random signal; by using the one or more recorded signals, generate a dynamic system model for some aspect of the WPTS; and conduct a search for an optimum waveform for the drive signal by repeatedly using the generated dynamic system model to simulate a response to the drive signal while varying the waveform of the drive signal until the optimum waveform is found.

The details of one or more embodiments of the invention are set forth in the accompanying drawings and the description below. Other features, objects, and advantages of the invention will be apparent from the description and drawings, and from the claims.

DETAILED DESCRIPTION

Before presenting the details of the different embodiments, some of the issues that are being addressed by those embodiments will first be discussed.

Figure 2:
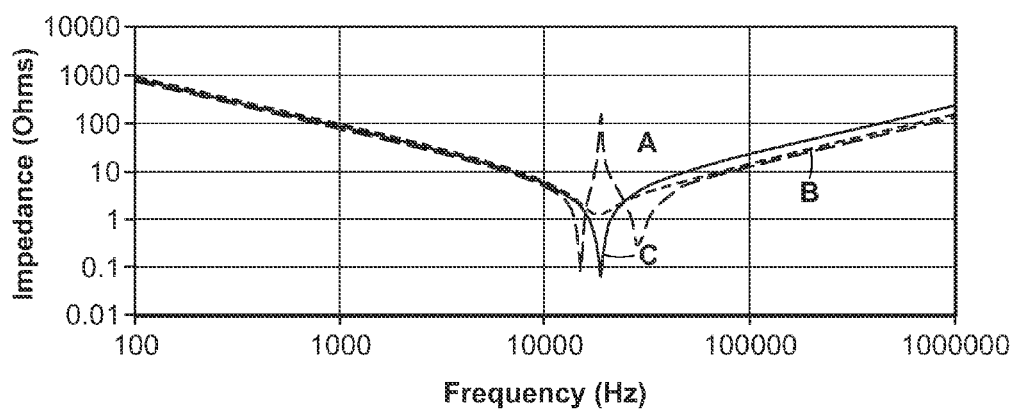
FIG. 2 presents the typical electrical impedance of a tuned coil in free space and in connection with a neighboring identical coil.

FIG. 2 gives a typical electrical impedance of a tuned coil, which may, for example, correspond to a transmit coil in a wireless power transfer system. The impedance of an ideal capacitor in series with an inductor has a "zero" null at the resonant or natural frequency, as shown by the curve C. When a second tuned coil (an inductor and capacitor in parallel), referred to as a receiver coil, is brought in close proximity to the transmit coil, the impedance at the natural frequency increases significantly as shown by curve A. The curve labeled B shows the impedance of the two-coil system when the receiver coil also includes a resistive load in the circuit to dissipate the power generated in the external loop. As can be appreciated, an impedance measurement, which only requires access to the two terminals of the transmit coil, could provide a very convenient tool for gaining insight into the operation of the circuit.

As illustrated by curve A in FIG. 2, a more important phenomenon that occurs when the two coils are brought into close proximity to each other is frequency splitting. When the transmit coil and receiver coil come in close range, two or more frequencies can be observed where locally in the frequency domain the power transfer is optimal. In other words, one observes two minima, one on each side of the natural frequency. (For further discussion of this phenomenon see: Alanson P. Sample and Joshua R. Smith, Analysis, Experimental Results, and Range Adaptation of Magnetically Coupled Resonators for Wireless Power Transfer, 2010 IEEE; and Huang, X. L., et al., Resonant Frequency Splitting Analysis and Optimization of Wireless Power Transfer System, PIERS Proceedings, Russia, Aug. 19-23, 2012.)

Figure 3:
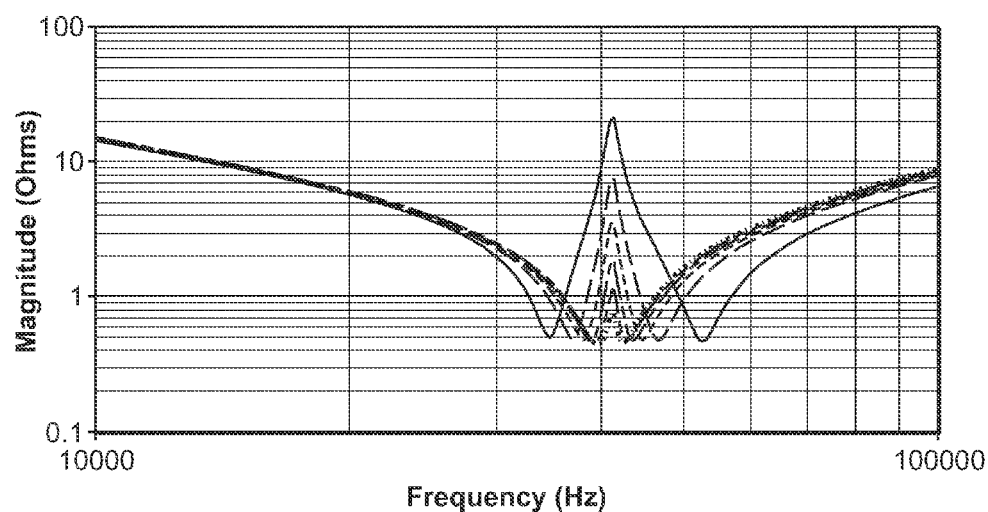
FIG. 3 shows the transmitter coil impedance spectra for two coils spaced apart from each other by differing amounts.
Figure 4:
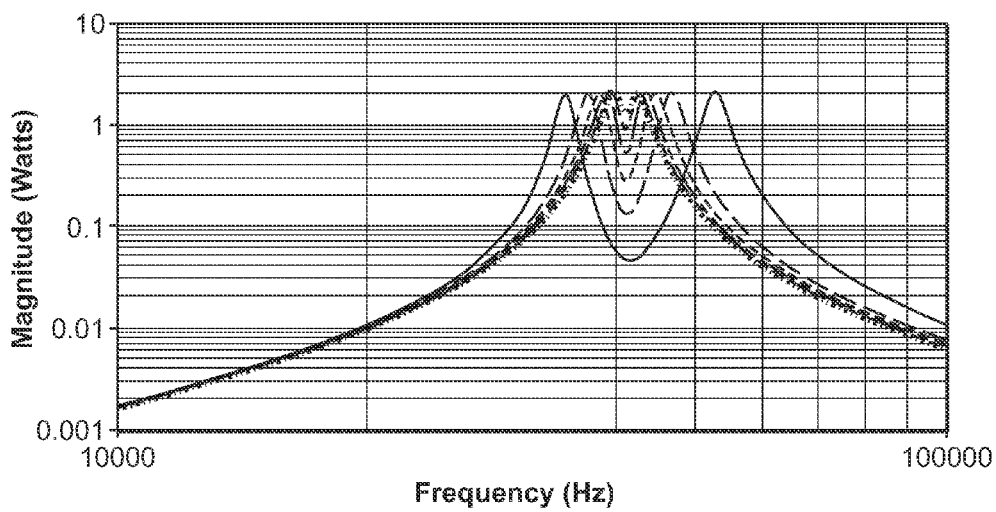
FIG. 4 shows the transmitter coil power spectrum corresponding to the coil impedance spectra of FIG. 3.

FIG. 3 gives the typical impedance of a transmit coil at several distances from the receiver coil. As the coils get progressively closer to each other, the peak in the impedance at the natural frequency increases and the two frequencies at which the impedance minimums occur on either side of that location spread further apart. From those impedance spectra, power spectra indicating how much power is going into the coil can be calculated. The corresponding power spectra are shown in FIG. 4. As clearly indicated, the power is maximal at two frequencies whose separation becomes smaller as a function of the separation of the two coils, until the two peaks merge for all practical purposes at longer separations (merge at natural frequency of system).

Figure 5:
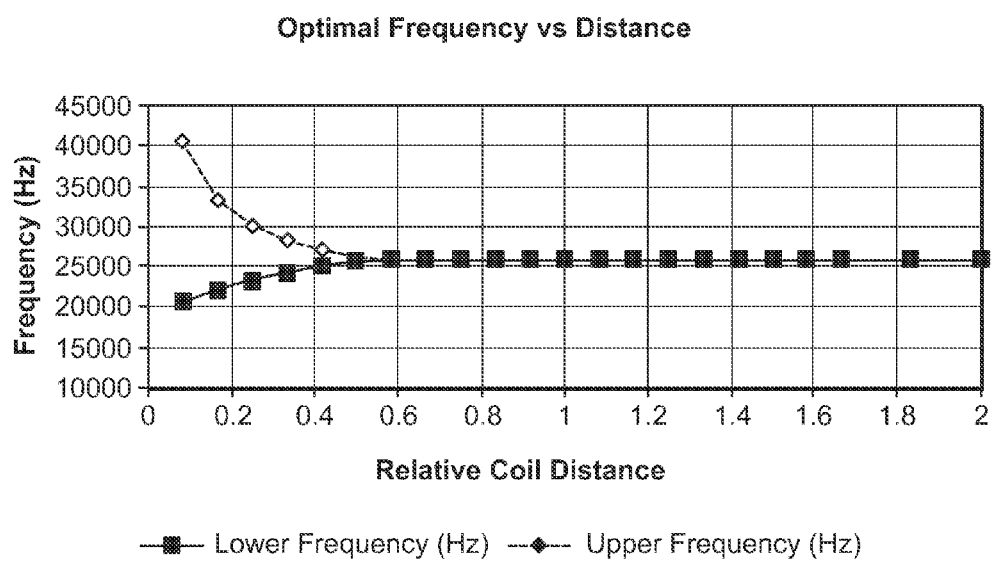
FIG. 5 presents the optimal coil frequency for two coils versus their separation distance.

FIG. 5 presents for a different wireless system the optimal frequency at which the maximum power transfer occurs versus the relative separation distance of the two coils in terms of coil diameters. As can be observed, when the distance between the coils is less than about half the diameter of the coils, there are two frequencies at which a maximum power transfer is observed. In a fixed setup, it is easy to select an optimal oscillator frequency to transfer power. In a dynamic situation, however, when coils move relative to each other and the distance between the coils is unknown, it becomes a challenge to maintain optimal power transfer.

Normally, the objective is to maximize the power transfer to the load. In a laboratory environment, it is possible to connect sense leads to measure power generated by the power circuitry in the transmitter and to measure power received by the load. It is then possible to sweep though all frequencies and periodically measure the ratio of received over transmitted power, find the frequency at which the peak power transfer occurs, and adjust the oscillator frequency accordingly. Finding the optimal frequency can be done using a number of algorithms developed in optimization theory. However, due to frequency splitting and the possible existence of two local optimum frequencies, techniques involving stochastic minimization should be used. When an optimum is found, the optimum frequency can be tracked in real time more rapidly through local searches.

In real life applications, however, such as cars moving relative to each other or over transmit coils, it may not be possible to directly measure the power dissipated in the load. Automatic frequency tuning can be achieved through directional couplers located, for example, between the transmit and receiver coils to measure the incident and reflected power (see, Sample and Smith). Another technique might involve wirelessly transmitting the required measurements, such as load current, voltage, and power, from the receiver to the transmitter. This could be done through sending a modulated signal from the receiver coil to the transmit coil by using a different frequency band that is not affected by the power transmit signal. Alternatively, other transmitting media could be used to send the information back to the transmitter, such as optical or acoustic signals. Secondary coils could be embedded in the power coils in order to transmit such signals.

As shown by Sample and Smith, modeling techniques can be used to relate transmitted power to coil position and orientation. In this case, position sensors that give the distance and orientation between the two coils can be used to identify the optimal power frequency.

Figure 1:
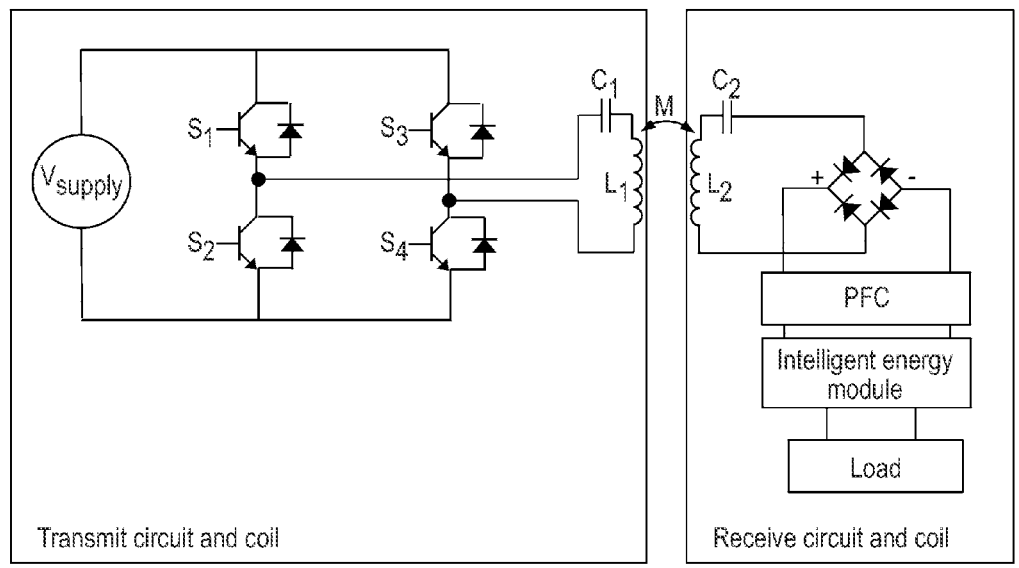
FIG. 1 depicts a power transfer circuit with a transmit coil $L_1$ and a receiver coil $L_2$.

The power transfer system shown in FIG. 1 includes several nonlinearities, such as in the rectifiers and in the secondary converter. If the system was linear, a number of techniques described in the engineering literature could be used to quickly identify the system and from there extract optimum parameters. However, if such techniques were to be used to find how perturbations in the transmit signal would affect the signal observed in the load, they would probably fail or give inaccurate descriptions due to the presence of hard nonlinear elements, such as rectifier diodes, in the circuit.

It also has been found that increased power transfer can be achieved using a non-sinusoidal transient waveform. This is of particular benefit since switching power modules or power FETs are used to minimize power losses in the electronics, and these generate signals in the form of pulses or steps rather than sinusoidally. Such power modules or transistors include IGBT (integrated gate bipolar transistors) and HEXFET® modules, IGBT's typically being capable of switching at higher voltages and HEXFETs being capable of switching at higher frequencies, e.g. up to tens of Mega Hertz in frequency.

Deriving a systematic method to determine the optimal wave shape of such a signal in real-time while coils are translating and rotating with respect to each other is one of the objectives achieved by the methods described below.

Nonlinear System Identification

At least some of the embodiments described herein employ nonlinear system identification to achieve the results that are achieved. So, before discussing the details of the various embodiments, a brief review of nonlinear system identification will first be presented.

As is well known from Fréchet's Theorem, any finite-memory time-invariant nonlinear dynamic system can be represented with arbitrary precision with a finite order Volterra series for all inputs that are square integrable over a finite interval. A Volterra series is similar to a Taylor series, except it can capture "memory" effects of devices such as capacitors and inductors. A Volterra series, which represents a functional expansion of a dynamic, nonlinear, time-invariant functional, is an infinite sum of multidimensional convolutional integrals of the following form:

$$y(t) = K_0 + \sum_{n=1}^{+\infty} \int_{-\infty}^{+\infty} \ldots \int_{-\infty}^{+\infty} K_n(\tau_1, \tau_2, \ldots \tau_n) \cdot x(t-\tau_1) \cdot x(t-\tau_2) \cdot \ldots \cdot x(t-\tau_n) d\tau_1 d\tau_2 \ldots d\tau_n$$

Closely related to the Volterra series is the Wiener series. In the Wiener series, the terms are orthogonalized for a purely random white noise input, and are more readily identified using, for example, cross-correlation techniques.

Korenberg (in Parallel Cascade Identification and Kernel Estimation for Nonlinear Systems, Annals of Biomedical Engineering, vol. 19, pp. 429-55 (1990) expanded the above-referenced Fréchet's theorem by proving that any discrete-time finite-memory system that can be represented by a finite Volterra series can also be represented by a finite series of parallel cascades of a dynamic linear system followed by a static nonlinearity (i.e., by a cascade of Wiener systems or LN systems).

Figure 6:
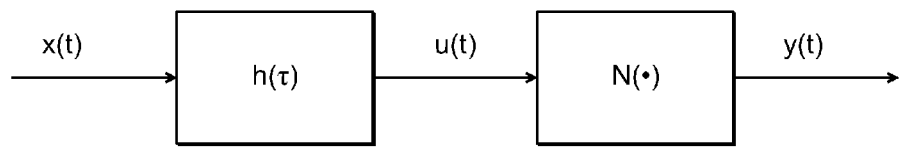
FIG. 6 depicts the block diagram of a Wiener system.

One example of a dynamic system model is the Wiener system, shown in FIG. 6. In such a system, a dynamic linear system represented by h(τ) is followed by a static nonlinear system represented by N(•). This is also referred to as an LN system. The dynamic linear system must be stationary (time invariant), stable and memory-less. It maps all the possible and acceptable set of input functions of time x(t) to an output function of time u(t). The static nonlinearity maps the range of acceptable real values "u(t)" to real values "y(t)" within the range of the function. These two components, the dynamic linear part and static nonlinearity, can be represented either parametrically or non-parametrically. Typically, a parametric representation involves some type of symbolic expression involving parameters $a_0, a_1, \ldots a_n$. For example, a polynomial such as the following may be used to represent a static nonlinearity:

$$f(x) = a_0 + \sum_{n=1}^{N} (a_n * x^n)$$

Figure 7:
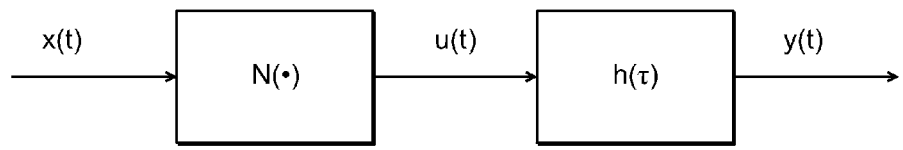
FIG. 7 depicts the block diagram of a Hammerstein system.

Wiener systems are instances of a class of models known as cascade or block structured systems. Other instances of cascade or block structured systems include: Hammerstein systems, as shown in FIG. 7, in which a dynamic linear system follows a static nonlinear system (NL); and cascade systems in which a linear system is followed by a nonlinearity and then by another linear system (LNL).

There are a number of system identification methods, some quite general, others being more specific and based on assumptions about properties of the input function applied to the system. They may also depend on the space in which the model is used. One of the most general nonlinear system identification techniques involves expressing a function giving an error in the predicted model. Using a parametric representation of the system, a nonlinear minimization technique, such as the Levenberg-Marquardt technique can be used to find the parameters that minimize the error function. This approach is general and straightforward to implement but typically computationally inefficient compared to other techniques.

In the case of the nonparametric form of the Wiener (LN) model, extremely efficient techniques have been developed by Korenberg and Hunter. They have also developed efficient techniques for identifying Hammerstein (NL) systems. Such techniques are described in Hunter et al., The Identification of nonlinear Biological Systems: Wiener and Hammerstein Cascade Models, Biological Cybernetics, vol. 55 pp. 135-44 (1986). And they have developed practical and efficient techniques to identify a parallel cascade of a linear-system followed by a static nonlinearity and another linear system (LNL), as described, for example, in Korenberg et al., The Identification of Nonlinear Biological Systems: LNL Cascade Models, Biological Cybernetics, vol. 55, pp. 125-34, (1986). It has been demonstrated that every continuous discrete time system with finite memory can be uniformly approximated by a finite sum of LNL systems.

The nonparametric functions implemented numerically end up being represented as sampled functions and involve a very large number of numerical values. Therefore, often these sampled data functions are converted to a parametric form. In this way, the efficiency of computation is preserved and the final representation ends up being more parsimonious. In many cases, after inspection of the impulse response the order of the system may be inferred and after fitting a simplified reduced-order model the impulse response ends up being filtered and less noisy.

Additional explication of the use of nonlinear system identification, with respect, more particularly, to Wiener and Volterra kernels, may also be found in the following references: Korenberg, et al., Exact Orthogonal Kernel Estimation From Finite Data Records: Extending Wiener's Identification Of Nonlinear Systems, Annals of Biomedical Engineering, vol. 16, pp. 201-14 (1988); Korenberg, et al., The Identification of Nonlinear Biological Systems: Wiener Kernel Approaches, Annals of Biomedical Engineering, vol. 18, pp. 629-54 (1990); and Korenberg, et al., The Identification of Nonlinear Biological Systems: Volterra Kernel Approaches, Annals of Biomedical Engineering, vol. 24, pp. 250-68 (1996). Further details may also be found in U.S. Pat. Appln. Pub. No. 2012/0098481 entitled "Apparatus and Method for Rapidly Charging Batteries" by Ian W. Hunter and Serge R. Lafontaine, the contents of which are incorporated herein by reference.

It should be noted that a system that has hysteresis lends itself to a parametric approach, whereas it does not lend itself to the use of the above-mentioned Korenberg and Hunter fast identification methods for identifying structured blocks. As noted above, if the parametric approach is used, then the Levenberg-Marquardt technique can be used to find the parameters that minimize the error function, e.g. the difference between the predicted Wiener output and the real system output.

It should be understood that the above-mentioned techniques can be employed, where appropriate, to perform the nonlinear system identification discussed herein.

Application of Nonlinear System Identification to Wireless Power Transfer

In embodiments described herein, nonlinear system identification using the techniques mentioned above is applied to improve wireless power transfer and fast chargers in order to adjust the parameters of the power signal fed to the transmit coil in order to: detect when a receiver coil is in close enough proximity to start transmitting power; adjust the frequency automatically as the receiver coil moves; adjust the waveform of the signal used to transmit power; and detect when an object interferes with the power transmission.

Various embodiments that implement these functions are described in detail below.

The Wireless Power Transfer System

Figure 8:
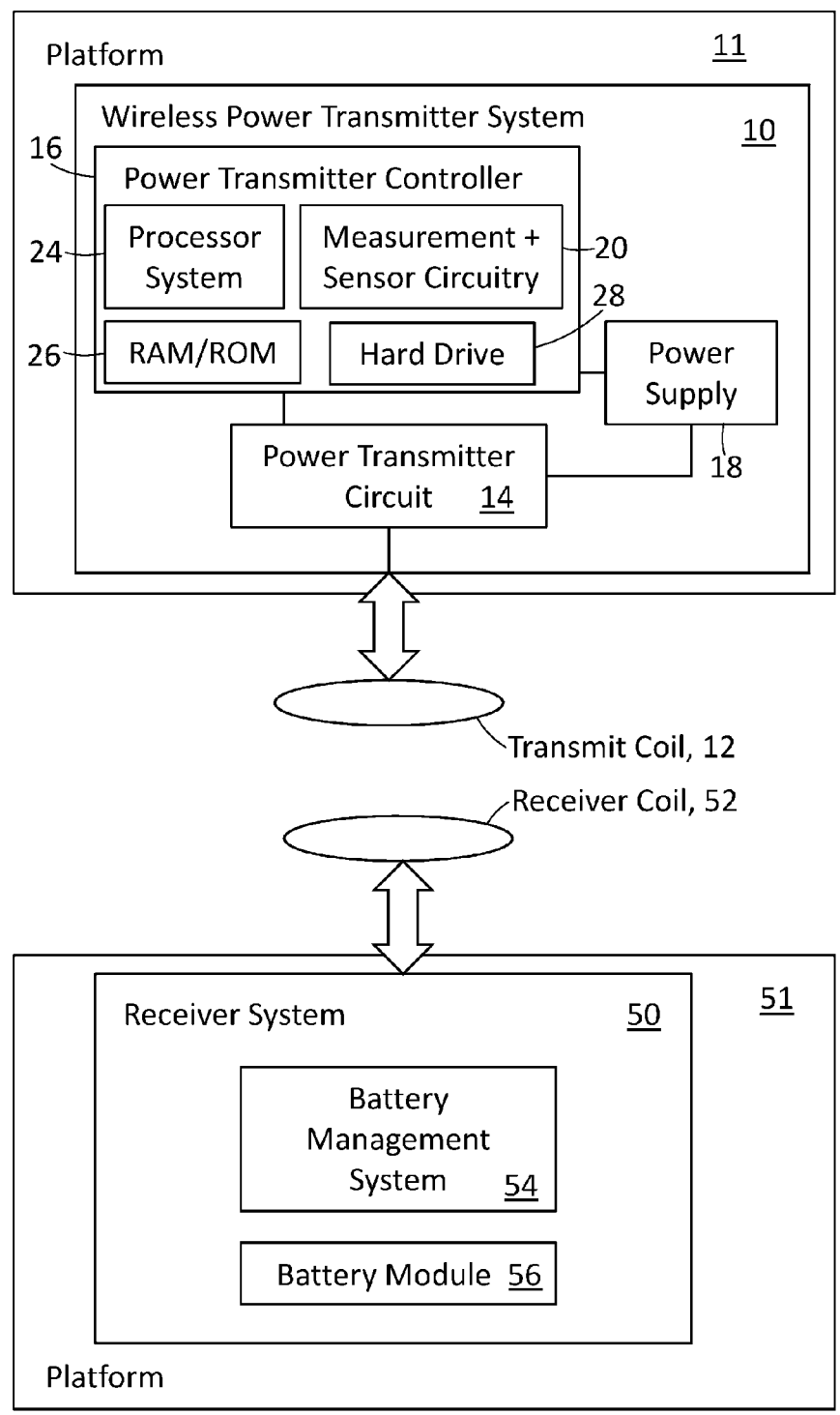
FIG. 8 is a block diagram of a wireless power transfer system including transmit and receiver coils.

Referring to FIG. 8, an example of a system in which the various embodiments can be implemented includes a wireless power transmitter system 10 and a receiver system 50. Depending on the desired application, the transmitter system might be located on a platform 11, which might be a stationary platform or it might be a mobile platform, such as a vehicle or the wheel on a vehicle. The receiver system is located on a mobile platform 51 (e.g. an electric vehicle or the wheel on a vehicle) that includes a chargeable battery module 56 for storing the energy to operate equipment on the mobile platform, e.g. the electric engine.

The transmitter system includes a transmit coil 12 through which power is wirelessly transferred to a receiver system by way of resonant inductive charging (RIC). The transmitter system also includes a power transmitter circuit 14 which drives transmit coil, a power transmitter controller 16 which operates power transmitter circuit 14 and performs the functions to be described below, a power supply system 18 for providing power to transmit coil 12 and for powering the various other electrical components, and sensor and measurement circuitry 20 which is capable of measuring and recording current and voltage signals at transmit coil 12.

The controller includes a processor system 24 (including one or more processors) for running the algorithms that are described herein, for executing the code for operating the power transmitter circuit, and for performing other functions associated with the power transmitter system. It also includes memory (RAM and ROM) 26 for storing code that is executed by processor system 24, including the code corresponding to the functionality of the algorithms described herein, and for storing data that is used by processor system 24 and data that is generated by processor system 24 in the course of implementing the algorithms described herein. There is also a hard drive 28 connected to the processor system and to which processor system 24 has access. It provides computer-readable, digital storage for the programs which are loaded into active memory and which are run on the processor to implement the algorithms described herein.

The receiver system 50 includes a receiver coil 52 through which it receives power wirelessly transmitted through transmit coil 12. It also includes a rechargeable battery module 56 (including for example lithium ion battery cells) and a battery management system 54 for managing the operation of battery module 56. With regard to the embodiments described herein, battery management system 54 is responsible for assisting in the charging of battery module 56 when power is wirelessly received through receiver coil 52 from a neighboring power transmitter system.

Detecting the Presence of a Receiver System.

Typically, it is preferable to energize the transmit coils only when a receiver coil is in position to receive power. The presence of a receiver coil could be detected using a number of means, such as a proximity switch, RFID tags, a low power signal radiated from the receiver coil to the transmit coil in a sideband, using acoustic or optical transceivers, or an operator that pushes on a button. But even if one of those techniques is used, there is still a need to confirm that the detected receiver is in the proper location. There will be also cases where it would be desirable to automatically detect the presence of a legitimate coil and automatically start charging when the coil is in position.

As shown in FIG. 2, the impedance measured from the transmit coil goes through significant changes as a receiver coil moves towards the receiver and this offers a means to detect a receiver coil. The impedance can be obtained by sweeping a pure sine wave signal over a frequency range and plotting the ratio of voltage to current as a function of frequency. However, system identification offers a better approach. In systems theory, a dynamical system maps a domain of admissible time functions to a range of output time functions. A coil can be considered as a system that is excited by a time-varying voltage (or current) and produces a time response in the form of a current (or voltage). Standard non-parametric time-domain linear system identification techniques provide a system model as an impulse response which can then be used to calculate the frequency domain system response, which corresponds to the impedance in the case of the transmit coil. Such techniques are described in the following publicly available references: Eykhoff, P., System Identification: parameter and state estimation, Wiley, London (1974); Goodwin, G. C., Payne, R. L., Dynamic system identification: experimental design and data analysis, Academic Press, New York (1977); Graupe D, Identification of systems, Van Nostrand Reinhold, NY (1976); and Ljung, System Identification—Theory for the User, 2nd Ed., PTR Prentice Hall, (1999).

As mentioned above, systems theory also provides a number of nonlinear system identification techniques providing nonlinear system representations such as the kernels of a Volterra series expansion or blocks of a structured block system representation.

In nonlinear system identification, the linear part, which corresponds to the usual admittance (impedance} measurements, is obtained in the time domain in the form of an impulse response which can then be mapped in the frequency domain using well established techniques (e.g. Discrete Fourier Transform) to obtain the impedance spectra. The nonlinear components, which are the higher order Kernels in the case of a Volterra series or nonlinearities in the case of the block structured approach, give a signature of nonlinear components such as electronic components (rectifiers, etc.) present in the secondary coil. Hence, the mere presence of nonlinear components will provide information about the presence of a system to charge or power. This, however, may not be sufficient in cases where other systems including nonlinear components, usually in the form of other electronic components, might come in the vicinity of the transmitter.

Figure 9:
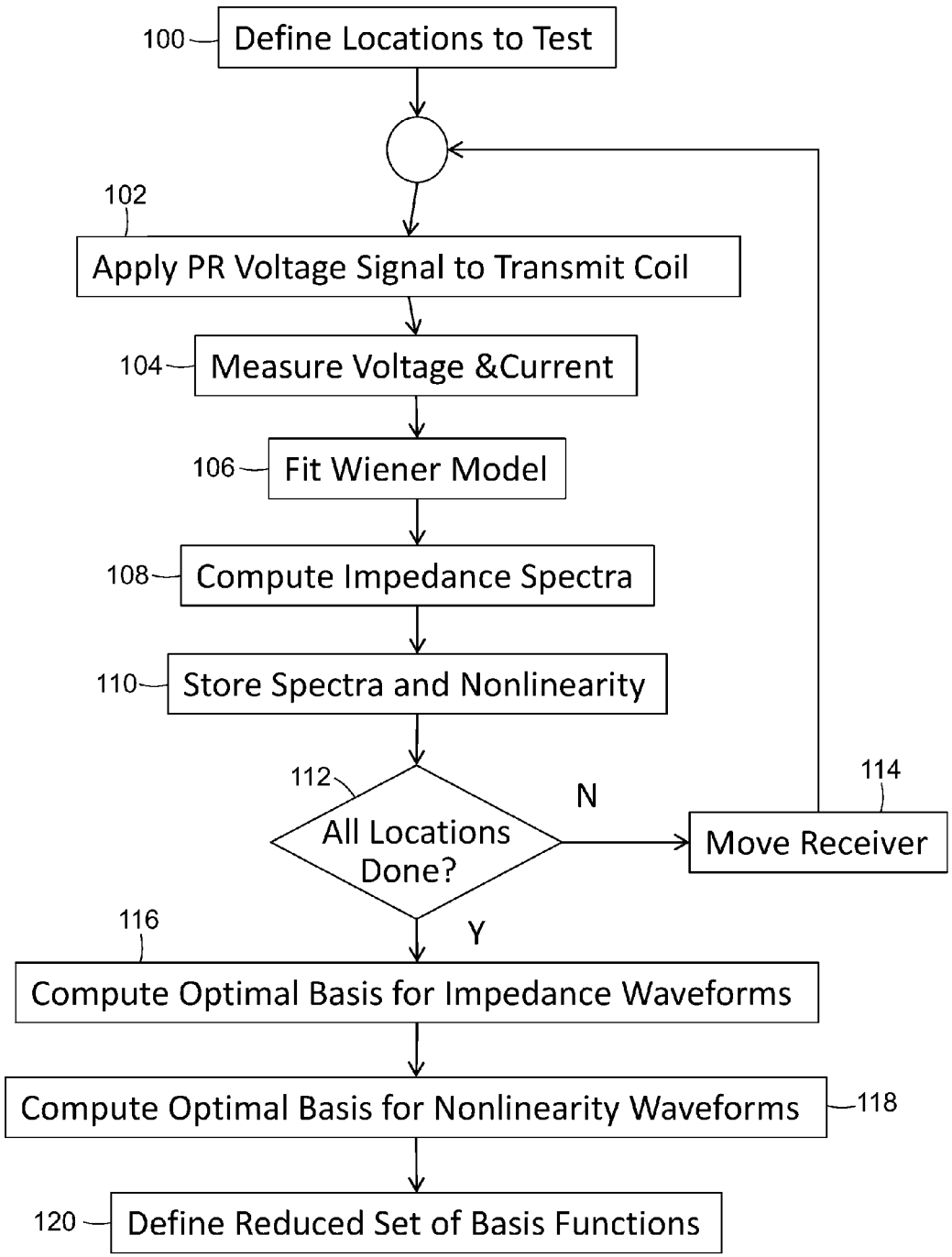
FIG. 9 presents a flow chart of an algorithm for pre-training a transmitter power controller of a wireless power transfer system for detecting a wireless power receiver system.
Figure 10:
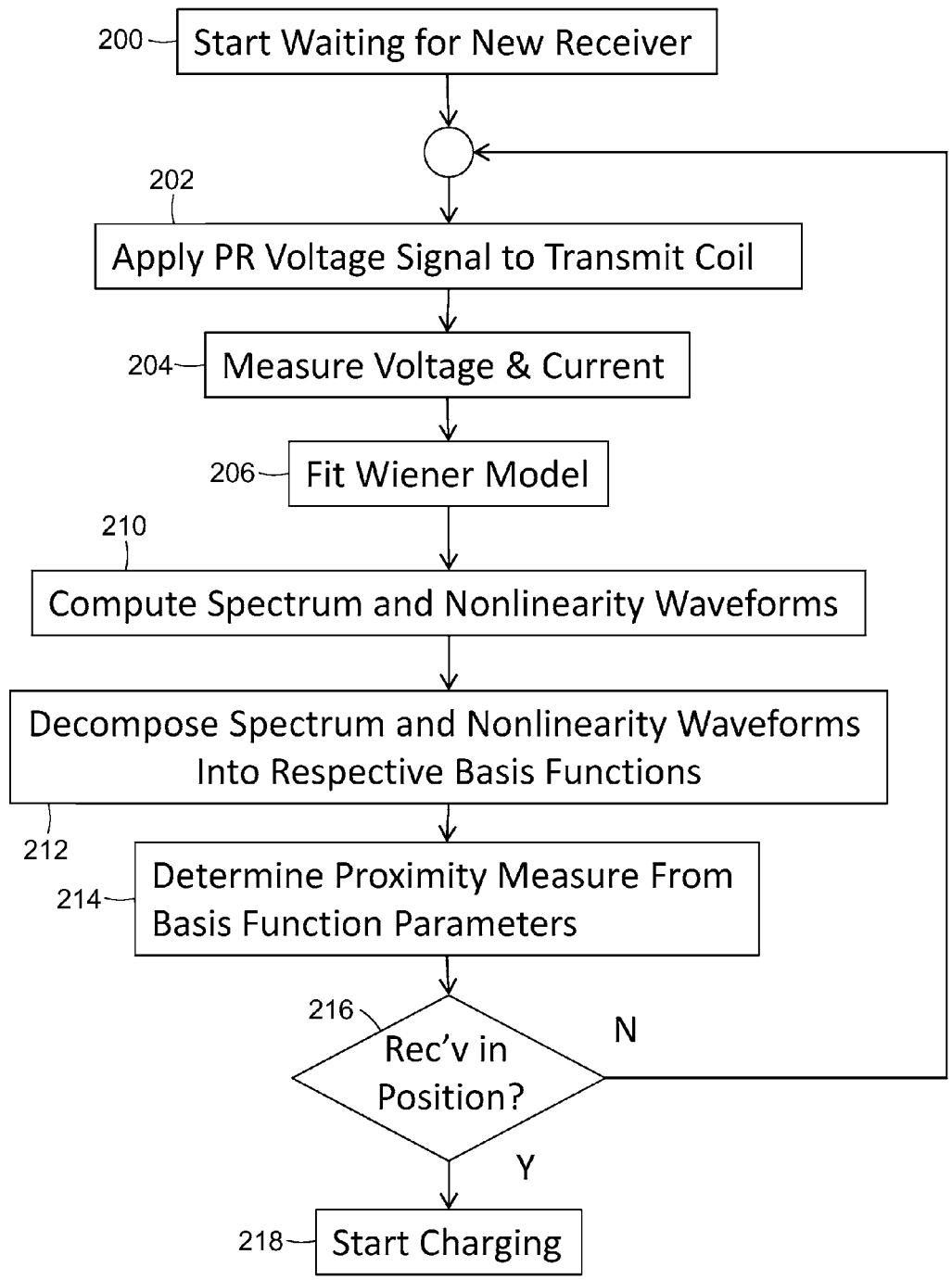
FIG. 10 presents a flow chart of an algorithm implemented by the transmitter power controller to detect the presence of a wireless power receiver system.

In the case where it is known that all receivers have nearly identical characteristics, a coil detection system can be pre-trained as shown in FIG. 9. A first receiver is used at different locations, and possibly tested for varying charge levels and ambient temperatures. A power signal is applied to the transmit coil and nonlinear system identification used to obtain different dynamic system models or representations thereof for each position and for other required parameters. These different models are kept in a database to define a model parameter space. Then, as shown in FIG. 10, a detection phase is implemented in which experiments are repeatedly performed that involve applying a PR (pseudorandom) signal and using nonlinear system identification to model the resulting coil dynamics.

In order to parameterize the space of nonlinearities and impedance spectra, a set of optimal and orthogonal basis functions is determined using techniques such as Singular Value Decomposition (SVD), Principal Component Analysis (PCA), wavelets, or splines. The model functionals are decomposed into their principal components, and the coefficients thus obtained, when exceeding a threshold, are used to indicate the presence of a receiver coil. For further discussion of such techniques, refer to Chatterjee, Anindya, An introduction to the proper orthogonal decomposition, Current Science, Vol. 78, No. 7, 2000.

The operation of the algorithms illustrated in FIGS. 9 and 10 will now be described in greater detail.

With reference to FIG. 9, the procedure for pre-training the transmitter power controller begins with first defining a representative set of system configurations for which tests will be performed (100). The tests are performed using systems that are identical to those on which the detection will be performed in the field. The representative set of configurations will include at least a range of locations and orientations of the receiver coil relative to the transmit coil. In addition, it might also include different values for one or more operational parameters that might be expected to impact on the details of the nonlinear model. Such operational parameters might include, for example, the temperature of the receiver system and the state of charge of the battery being charged by the receiver system. The selection of locations and orientations is guided by the relative physical relationships that are considered to be relevant during operation of the power transmitter in the field. For example, this might involve establishing a maximum distance at which power transfer can begin to take place and then defining further closer distances by moving the receiver coil toward the transmit coil in incremental steps. To build a more complete set of data, this could be repeated as the receiver coil is moved towards the transmit coil along different paths and for different orientations of the receiver coil relative to the transmit coil.

Using this defined set of locations and orientations, data is gathered and processed for each of the defined configurations (102-114). This involves, for each configuration, driving the transmit coil of the power transfer circuit with a pseudo-random voltage signal (e.g. GWN voltage signal or PRBS) that includes sufficient power to stimulate the non-linear elements in the wireless receiver system (102). While power is being applied to the transmit coil, the voltage and current at the transmit coil are measured and recorded (104). Since the applied voltage waveform is known, theoretically it should only be necessary to measure the current signal at the transmit coil. However, in practice by the time the applied voltage signal reaches the transmit coil it is likely to be slightly different due to the effects of other elements in the transfer circuit. Thus, to achieve a higher level of precision in modeling the system, it is desirable to measure both the current signal and the voltage signal at the transmit coil.

After measuring the current and voltage signals, a known nonlinear system identification procedure, such as one of those referenced above, is used to fit an appropriate nonlinear system model (e.g. a Wiener model) to the measured data to obtain an estimate of the linear and nonlinear waveforms characterizing the dynamic system model (e.g. impedance) for the measured system (106). In this case, the linear waveform is the impulse response representing the dynamic linear portion (or the transfer function), and the static nonlinear waveform could be a best-fit polynomial for the nonlinear static portion of the model.

In the described embodiment, the representation of the linear waveform is transformed into the frequency domain by using an appropriate technique (e.g. Fourier transform or FFT) for transforming the impulse response into the corresponding impedance spectrum (108). The computed impedance spectrum along with the corresponding nonlinear waveform is stored in association with the particular configuration for which it was computed (110).

This sequence of data acquisition steps is repeated for all defined configurations to build up a database of dynamic system models of the transmitter/receiver system. In other words, after storing the computed information for the just completed test, it is determined whether all locations have been tested (112). If more locations remain to be tested, the receiver coil is moved to another location or orientation among the defined locations/orientations (114), and the sequence of measurements and computations is repeated for the new configuration.

The resulting database represents a space of impedance spectra and nonlinearities. That space is then parameterized by determining an optimal basis for the two sets of stored waveforms. In other words, this is done for all of the impedance waveforms (116) and for all of the nonlinearity waveforms (118). Any of a variety of known techniques can be used to accomplish this. In the described embodiment, SVD (Singular Value Decomposition) is used. After computing the optimal sets of basis functions for the two sets of waveforms, a reduced set of basis functions is defined (120). This involves selecting the subset of optimal basis functions that is most effective in representing the waveforms and eliminating those basis functions that have little explanatory power in terms of representing those waveforms. Stated differently, it involves identifying that subset of the set of basis functions that is sufficiently discriminating. Techniques for identifying a reduced set are well known.

Using the systems that were employed to generate the data, an empirical determination is also made to identify for which positions and/or configurations of the receiver coil wireless power transfer can be successfully initiated. These determinations provide a basis for partitioning the model space to identify regions representing a detected receiver that is in position. Generally known classification methods are used to perform the partitioning or clustering of the model space to define those regions representing a receiver that is within an acceptable distance for initiating wireless power transfer.

The result of running the process depicted in FIG. 9 is a set of training data including a reduced set of optimal basis functions. The power transmitter controllers use the training data, including the data defining the dynamic system models in the model space and the optimal set of basis functions characterizing the model space, as well as the threshold criteria for classification of that space, to determine whether a receiver system is within range for initiating wireless charging. The training data is stored in local memory that is part of and/or accessible to the power transmitter controllers.

The algorithm that is implemented by the processor system of the transmitter power controller is shown in FIG. 10. The transmitter power controller, when activated to search for a receiver system within its vicinity (200), initiates a search loop in which it repeatedly examines the impedance of its transmit coil to detect the presence of a receiver system (202-216). Each time it enters this loop, it applies a pseudo-random voltage signal to the transmit coil (202) and measures and records both the voltage signal and the current signal of the transmit coil (204). It uses the same pseudo-random signal that was used to generate the training data stored in the transmitter power controller. The controller then uses the previously utilized nonlinear system identification procedures to fit a Wiener model of the dynamic system (e.g. the impedance or admittance of the transmit coil) to that measured data (206). This results in dynamic linear waveform and a static nonlinear waveform representing the nonlinear model. Since the stored reference data was represented in the frequency domain as an impedance spectrum, as opposed to the time domain as an impulse response, the transmitter controller transforms the dynamic linear waveform into the corresponding impedance spectrum so that it can be compared against what is stored in the database (208). At this point, the result of the processing is an impedance spectrum and nonlinear waveform.

Using the reduced set of basis functions that were derived for the reference data, the transmitter controller decomposes the impedance spectrum into its respective basis functions and decomposes the nonlinear representation into its respective basis functions (212). The result is a set of coefficients representing the weights given to the basis functions to represent the waveforms.

Then, using the classification information previously computed for the model space, the transmitter controller determines whether it has detected a receiver coil that is in position to commence wireless power transfer (214). It can do this, for example, by comparing points in model space representing the current measurements to the computed regions representing tests objects using the empirically derived thresholds.

If it is determined that a receiver coil has been detected within range for initiating wireless power transfer, the controller generates a signal causing the initiation of a wireless power transfer (216, 218). Otherwise, the transmitter controller repeats the just described detection loop (216, 202). The transmitter controller continues cycling through the loop until it detects a receiver coil with which wireless power transfer can be performed.

The approach described in connection with FIGS. 9 and 10 employs an indirect method. As an indirect method, a linear or nonlinear model is first obtained. Then, the waveforms for these models are decomposed using the appropriate basis functions. And only then can the parameters of the basis functions be used with a classification method to get a measure of goodness of position of a receiver unit.

In contrast, nonlinear system identification methods can also be used to implement direct methods to achieve the same goal, such as providing a measure of how close a receiver unit is. Such a direct method takes advantage of the fact that any nonlinear process that can be recast as a deterministic time invariant memory-less mapping of a domain of input functions to a range of output functions can be represented by a nonlinear system such as a Volterra series expansion or parallel cascade of structured blocks, and that the systems can be identified from an input function if enough information is contained in the input and output pseudo-signals. Further discussion of the principles underlying this approach can be found in Green et al., "Recognition of Adenosine Triphosphate Binding Sites Using Parallel Cascade System Identification", Annals of Biomedical Engineering, Vol. 31, pp. 462-470, 2003 (referred to hereinafter as Green).

Figure 11:
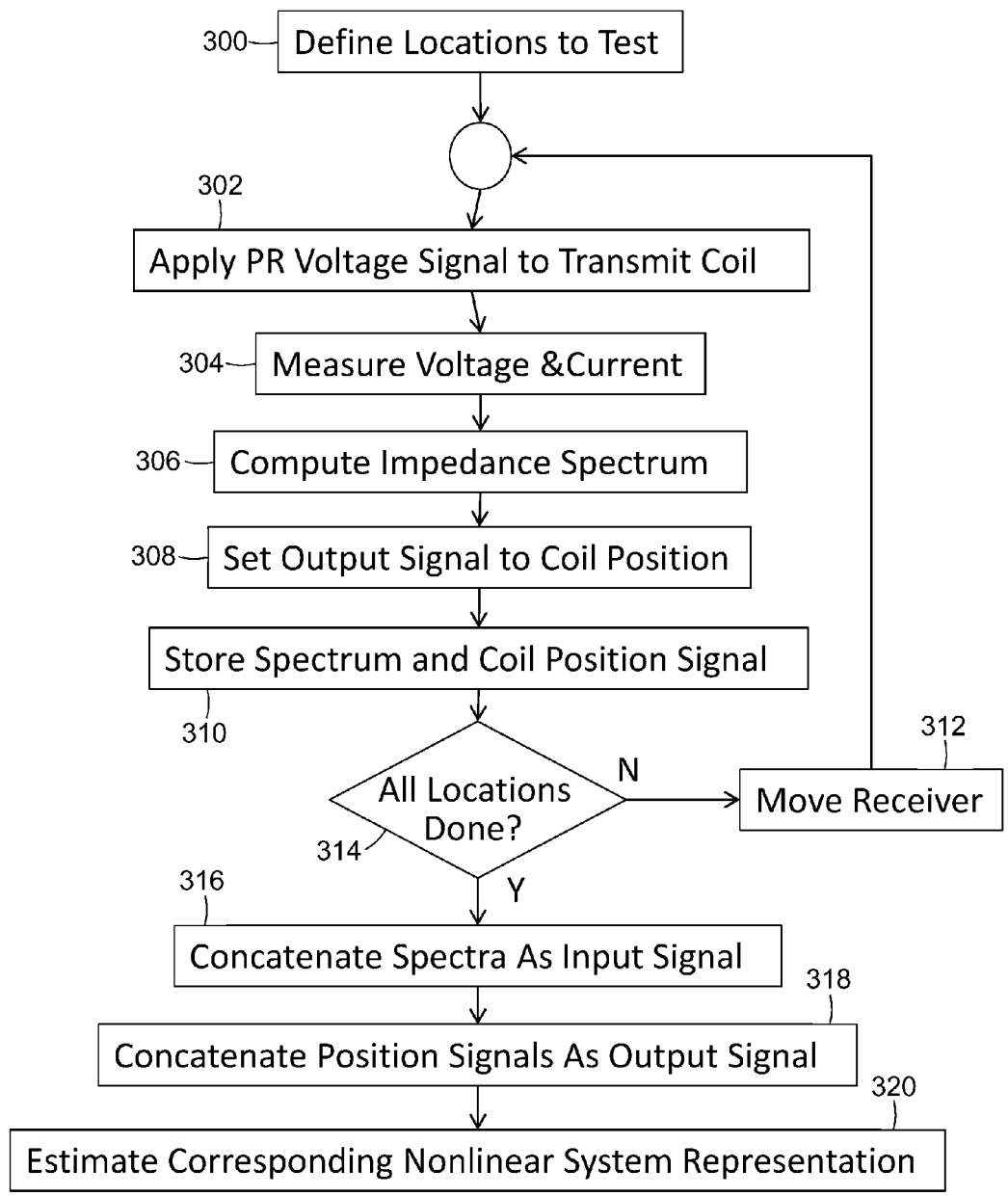
FIG. 11 presents a flow chart of an algorithm for creating a nonlinear filter for use by a transmitter power controller to detect the presence of a wireless power receiver system.
Figure 12:
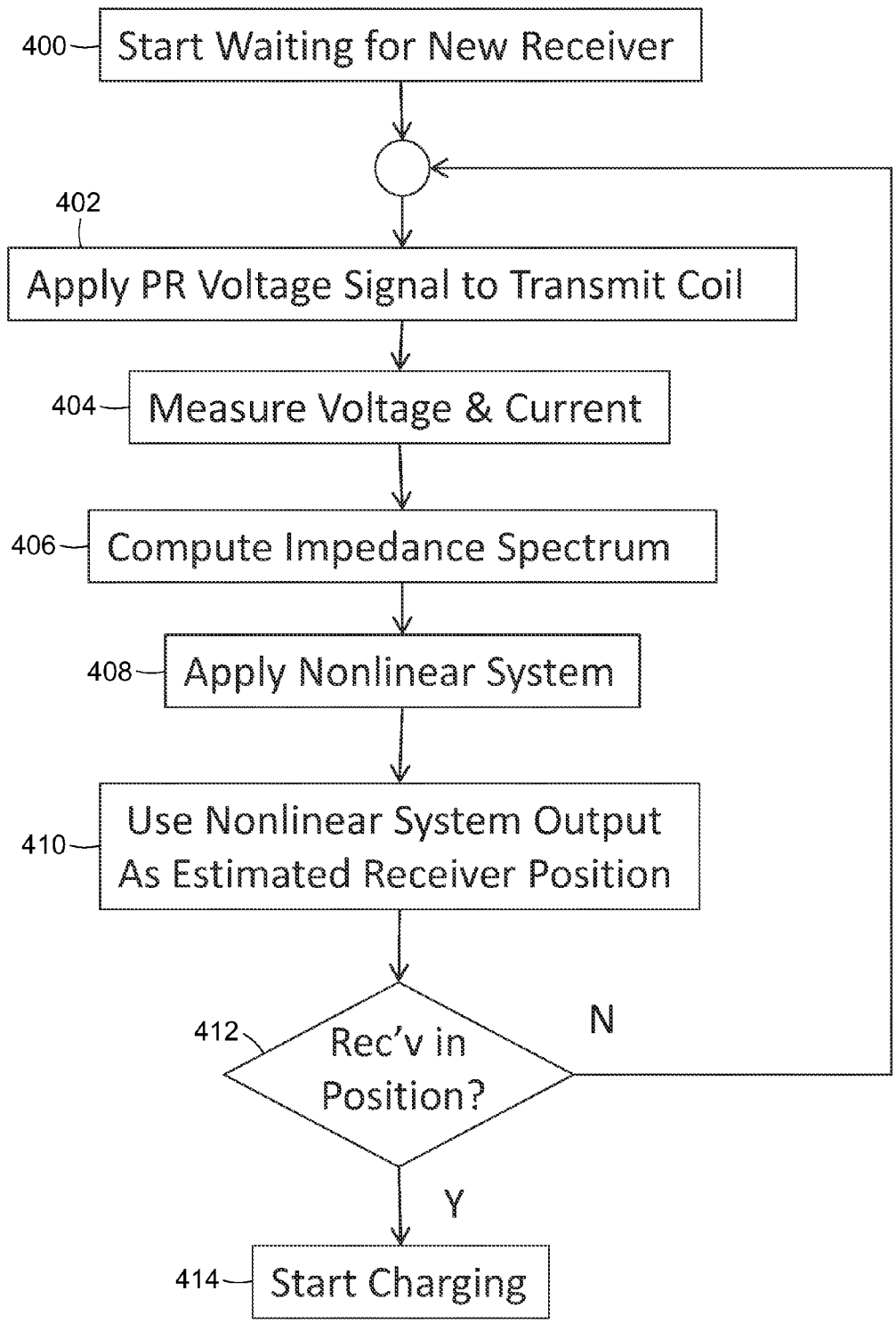
FIG. 12 presents a flow chart of an algorithm implemented by the transmitter power controller for using the nonlinear filter of FIG. 11 to detect the presence of a wireless power receiver system.

An embodiment that employs such an approach is illustrated in FIGS. 11 and 12. In the illustrated embodiment, the impedance of a coil is used to detect a receiver. In general, as shown in FIG. 11, a collection of cell impedance spectra for different receiver coil positions is collected. Then, assuming that each measured spectrum consists of N points, at the corresponding coil position a constant position signal is created which also consists of N points, and each point of the measured spectrum is assigned the corresponding receiver coil position. For system identification purposes, an input signal is created by concatenating together the impedance spectra, and an output signal is created by concatenating together the position signals. Subsequently, using nonlinear system identification, a nonlinear model, such as a parallel cascade of structured blocks, is obtained for that input-output system.

This model is then used, as shown in FIG. 12, as an estimator of receiver coil position. For this, an acquired spectrum for an unknown coil position is obtained and used as input to the estimated nonlinear model. The computed output from the nonlinear model directly provides an estimate of the receiver coil position. As explained in Green, the last value of the output signal is used as the estimated coil position.

The particulars of the algorithms shown in FIGS. 11 and 12 will now be described in greater detail.

FIG. 11 shows the procedure for pre-training a transmitter controller for detecting a receiver coil. As previously described in connection with FIG. 12, the procedure begins with first defining a representative set of system configurations for which tests will be performed (300).

Using this defined set of system configurations, data is gathered and processed for each of the defined configurations. This involves, for each configuration, driving the transmit coil of the power transfer circuit with a pseudo-random voltage signal (e.g. GWN voltage signal) that includes sufficient power to stimulate the nonlinear elements in the wireless receiver system (302). While power is being applied to the transmit coil, the voltage and current at the transmit coil are measured and recorded (304). After measuring the current and voltage signals, the impedance spectrum is computed (306). In the described embodiment, this is done using cross-correlations of the measured signals as follows:

$$H(x) = \frac{F\{C_{xy}(t)\}}{F\{C_{xx}(t)\}}$$

$$C_{xy}(\tau) = \int y(t)x(t-\tau)d\tau$$

$$C_{xx}(\tau) = \int x(t)x(t-\tau)d\tau$$

where $C_{xx}(\tau)$ is the autocorrelation of the voltage signal, $C_{xy}(\tau)$ is the cross correlation of the voltage and current signals, and $F\{\cdot\}$ represents the Fast Fourier Transform (FFT). In this case, the resulting computed impedance spectrum is represented by N points of data.

This is, of course, not the only way to compute the impedance spectrum. Other approaches are well known to persons of ordinary skill in the art. For example, one could simply compute the Fourier transforms of the measured signals and use that to compute the impedance spectrum. However, the use of the cross correlations has the advantage of reducing the effects of the noise.

The computed impedance spectrum corresponds to a coil configuration which is represented by a position or location relative to the transmit coil. That coil position is assigned a unique number (e.g. distance from the transmit coil) and a corresponding N-point coil position signal, with each point equal to the assigned number, is generated (30) and stored as an output signal along with its associated N-point impedance spectrum which for which it was computed (310).

This sequence of steps is performed for each of the defined configurations (314, 312). When completed, the result is a database of stored computed spectra and corresponding coil position signals for all defined configurations.

Once the measurement data for all of the configurations has been acquired, the impedance spectra for all of the configurations are concatenated together to form an input signal (316):

Input Signal=$\{H_1, H_2, \ldots, H_n\}$.

And all of the corresponding position signals are concatenated together to form an output signal (318):

Output Signal=$\{P_1, P_2, \ldots, P_n\}$.

These two signals are then treated as the input and output signals of a hypothetical nonlinear system. Nonlinear system identification is then used to obtain a nonlinear model, such as a parallel cascade of structured blocks, of that nonlinear system (320). This nonlinear model is stored in the transmitter power controller which will use it to directly estimate the position of the receiver coil during operation. In addition, a determination is empirically made with regard to what positions represent positions at which wireless charging can be performed. And that information is also stored for use by the transmitter power controller.

The details of the algorithm implemented by the transmitter power controller are illustrated in FIG. 12. The transmitter power controller, when activated to search for a receiver system within its vicinity (400), initiates a search loop in which it repeatedly measures the impedance of its transmit coil to detect the presence of a receiver system 402-412). Each time it executes this loop, it applies a pseudo-random voltage signal to the transmit coil (402) (optionally using the same pseudo-random signal that was used to generate the data set stored in the transmitter power controller) and measures both the voltage signal and the current signal of the transmit coil (404). Then, using the approach described in connection with FIG. 11, the controller computes from the measured voltage and current signals the N-point impedance spectrum for the transmit coil (406). Next, it applies this computed impedance spectrum to the nonlinear model that was generated in connection with FIG. 11 (408). The result is an indicator of the position of the receiver coil (410). If the output of the nonlinear model indicates that the receive coil is in position, the power transmit controller starts wirelessly charging the receiver system (412, 414). Otherwise, it repeats the just described loop to continue searching for a receive coil that is in position for charging (412, 402).

The above-described approach used the computed impedance. An alternative approach, which is likely to preserve more information about the nonlinearities in the system, is to use the measured current instead of computing the impedance. Such an approach is described later in connection with FIGS. 18A-B which relate to foreign object detection.

Auto-Tuning the Transmitter Frequency

The techniques described for the determining coil position are adapted to tune the power transfer circuit to an optimal frequency for wireless charging of the receiver system. When the coils are at a distance farther than a coil diameter, typically little tuning is required, as the optimal frequency for transmitting power does not change significantly and is known for that system. As noted above, this is not the case when the coils get closer. The optimal frequency may shift rapidly with change in position, as the coils get closer to each other. Thus, the optimal frequency must be computed at a speed directly related to coil velocities. In this case, techniques based on system identification offer a clear advantage in that the required impedance spectra can be determined much more rapidly. Rather than sweeping through frequencies, which can be a time-consuming process, a signal containing all the required frequency components is applied once, and from that the spectra is estimated.

The power going into the primary coil, which corresponds to the transmitted power plus some power dissipated in the coil itself as heat, can be derived from the impedance spectra. If the coil transmission system can be represented mostly by a linear system, the power going into the transmit coil is given from the integral of voltage and current. From the impedance spectrum, we get:

$$P(\omega) = \frac{1}{T}\int_0^T V_0 * \cos(\omega * t) * Z(\omega)^{-1} * V_0 \cos(\omega * t - \phi(\omega)) * dt$$

where the $Z(\omega)$ is the magnitude of the impedance and $\phi(\omega)$ is the phase.

$$P(\omega) = \frac{1}{2} \frac{V_0^2}{Z(\omega)} * \cos(\phi(\omega))$$

Hence, in the case of a linear system, optimal power transfer will occur where the product of the amplitude and cosine of the phase of the impedance is at a maximum. If the system is significantly nonlinear, the optimal frequencies will also be amplitude dependent.

In the case of a wireless power transmission system (WPTS), low-level voltages may not be large enough to stimulate internal nonlinear electronics involving semiconductor devices and thus the system will remain linear. It is therefore desired that power in excess of some minimal amount be delivered to the coil to observe the nonlinearities in the system. The random excitation signal may be applied as a voltage waveform to the coils, and the response is measured as the current flowing through the coil.

Nonlinear system identification is used to model the system and using the resulting nonlinear model, the optimum frequency is estimated. Ideally, the estimation process would be performed analytically. In other words, parametric closed-form equations would be used to represent the impulse response and nonlinearities, or higher order kernels. With closed-form analytical expressions, calculating the system's responses as well as finding parameter values where extrema occur can be done analytically. For finding optimal frequencies, an analytical response giving the coil power as a function of frequency is derived for sinusoidal input voltage waveforms, differentiated to solve for zeros, and zeros that occur at maxima are selected.

However, the analytical representations may become too complex to handle or be solved. In that case, it is possible to resort to numerical techniques. For quickly locating an optimal frequency, an optimization technique along a line (frequency axis) can be implemented. For references discussing such techniques refer to Fletcher, R. Practical Methods of Optimization, Second Edition, John Wiley & Sons, LTD, 1987; Press, W. H. et al., Numerical Recipes in C++, Cambridge University Press, 2002; Nocedal, J. and Wright, S. J., Numerical Optimization, Springer Series in Operations Research, 1999; and Press, William H. et al., Numerical Recipes 3rd Edition: The Art of Scientific Computing, Cambridge University Press, $3^{rd}$ Ed., 2007). To this end, the nonlinear system response is simulated numerically and the transmitted power is used as the objective function that is maximized. The same approach could be used for semi-analytical representations, where non-parametric functions could be approximated by a Chebychef series expansion.

Figure 13:
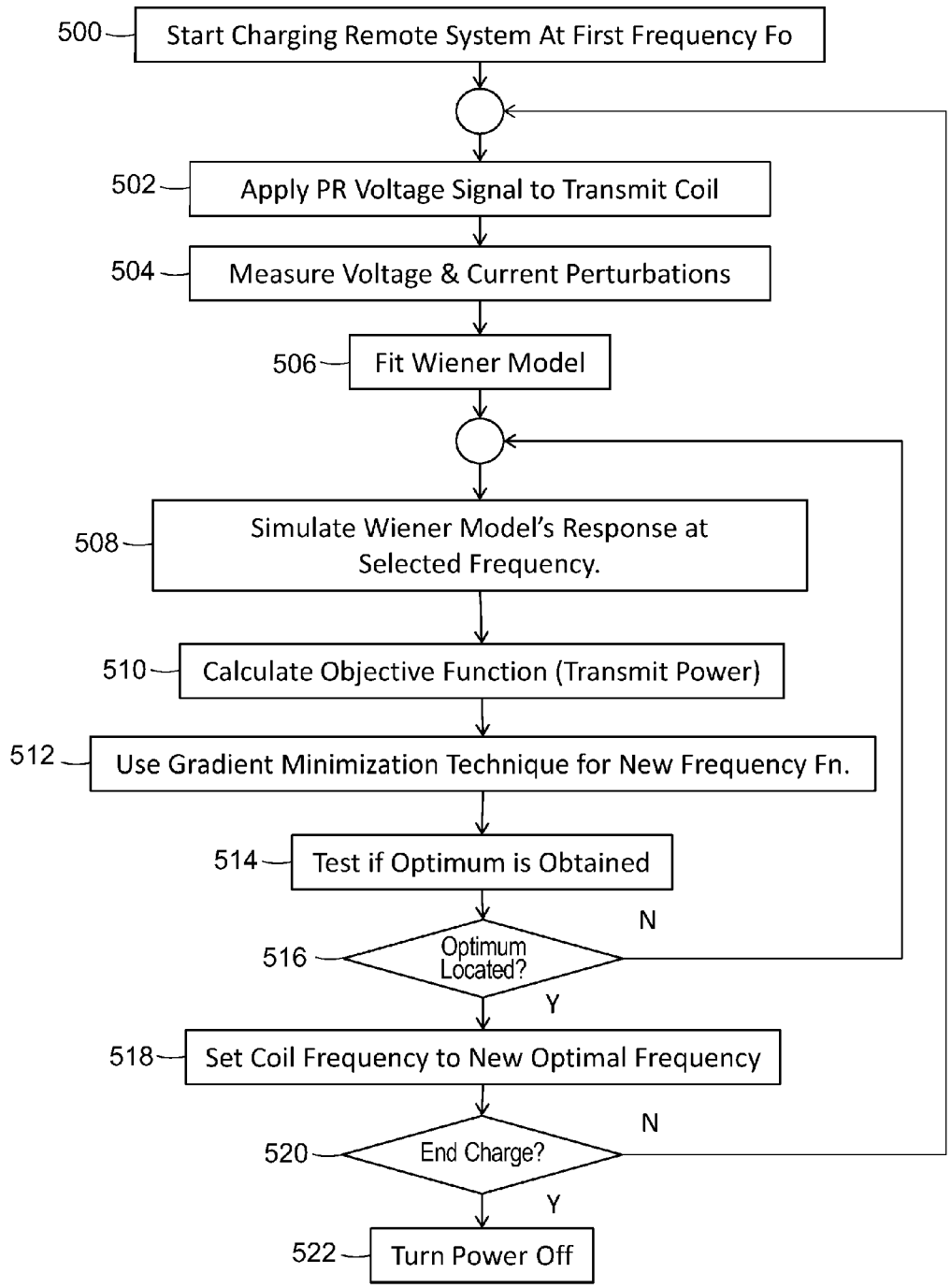
FIG. 13 presents a flow chart of an algorithm implemented by the transmitter power controller to auto-adjust the frequency of the wireless power transfer signal.

An example of an algorithm employing such an approach to automatically tune the coil frequency is presented in FIG. 13. This algorithm is implemented by the transmitter power controller. In general, nonlinear models are continuously acquired by repeatedly applying pseudo-random voltage perturbations, sampling the coil voltage and current, and fitting a nonlinear model to the measured data. The nonlinear models are then used to simulate digitally the power going into the coil as a function of signal frequency. And a search algorithm is used to find frequencies at which the power should be calculated and iteratively locate the optimum frequency.

As indicated in FIG. 13, when a receiver coil is determined to be within a distance over which charging can successfully occur, the transmitter power controller sets the wireless charging frequency to a predetermined frequency $F_0$ corresponding to the estimated resonant frequency of the charging system and begins wirelessly charging at that frequency (500). The controller then enters a loop in which it searches for the optimum charging frequency. To conduct the search for the optimum frequency, the transmitter power controller uses nonlinear system identification to construct a nonlinear model of the transmitter-receiver system and then uses that model to find the optimum frequency. The construction of the model is done in a manner similar to what has already been described in connection with the process for detecting the presence of a receiver coil. It applies a pseudo-random voltage signal as a perturbation signal to the transmit coil (502) and measures both the voltage and the current signals of the transmit coil (504). The controller then uses nonlinear system identification to fit that measured data to a Wiener model of a dynamic system representation (e.g. the impedance) of the transmit coil (506). Once the Wiener model has been derived, the controller enters a loop in which it uses that nonlinear model to search for the optimum frequency (508-516). More specifically, it simulates the nonlinear model's response to a voltage signal at the previously selected frequency (508). From the simulated response, it calculates transmitted power as the objective function that is to be maximized (510). Then, it uses a known gradient minimization technique to find a new frequency at which the transmitted power is maximized (512). During this search for the optimum frequency, the controller uses the nonlinear model to repeatedly simulate a response, each time changing the values of the frequency of for drive signal until an apparent optimum is found. After finding the apparent optimum frequency, it tests whether that new frequency is indeed an optimum (514).

If it is determined that an optimum frequency has not yet been found, the controller repeats the procedure to continue the search for the optimum frequency (516). In other words, it simulates the nonlinear model's response to the new frequency (508), calculates the objective function at that new frequency (510), and uses the gradient minimization technique to find a new frequency at which the objective function is maximized (512). The controller repeats this process until the optimum is found, at which point it sets the frequency of the transmit coil to this optimum frequency (518).

After setting the drive signal to the computed optimum frequency, the controller tests whether charging is complete (520). It can determine this through detecting an abrupt change in the impedance of the receiver coil when the receiver system terminates or switches off the charging of the battery module. Alternatively, if there is a communication channel back to the transmitter system, the receiver system can send a signal over that channel to inform the transmitter system that the charging function has ended. When the controller detects that charging is complete (520), it turns off the power thereby terminating wireless power transfer to the receiver coil system (522).

If charging is not complete, it is possible that the relative positions of the transmit and receiver coils might have changed thereby affecting the value of the optimum frequency, so the search for a new optimum frequency is resumed. In other words, it branches back to the beginning of the algorithm (502) to continue the search.

Up to this point, it has been assumed that the wireless receiver system does not communicate data on transmitted power back to the wireless transmitter system. If, however, data can be transmitted from the receiver system to the transmission system, a nonlinear model can be derived between a voltage applied to the coil V(t) and power P(t) going directly into an energy storage unit, such as a battery pack. The nonlinear model is then used as described previously to locate the exact frequency at which the maximum amount of power goes directly in an energy storage subsystem, rather than in the coils, which includes power losses in the coils and power electronics. In addition, the efficiency can then also be calculated, allowing one to choose between a maximum charging rate and a maximally efficient charging rate.

As an alternative and more efficient method to auto-adjust to the optimum excitation frequency, a direct method based on the above-described Green's method can be used. In that case, a detection algorithm, in the form of a nonlinear model, is first obtained offline. That is done by carrying out a number of experiments on a real system with the transmit and receiver coils at different locations and orientations relative to each other. For each location/orientation, an optimum coil frequency is determined and the corresponding coil current is recorded. Given that this process is carried out offline, the optimal frequency for each condition can be obtained either numerically or experimentally or both.

After all the tests have been carried out and from the results of those tests, both an input signal and an output signal are constructed for the purpose of nonlinear system identification. The input signal is created by concatenating all of the measured current signal responses to the random excitation signal. And the output signal is created by concatenating the optimum frequency values corresponding to those concatenated current signals. After that, nonlinear system identification is carried out to derive from those constructed input and output signals an optimal nonlinear frequency estimator which is a nonlinear model representing how the different response signals map into the corresponding optimal frequencies.

Once the optimal nonlinear frequency estimator has been obtained, it is used in real-time by the power transmitter controller to extract directly from a response signal an optimal excitation frequency to use. This is done by applying a pseudo-random excitation signal, which is usually the same as the pseudo-random signal used to construct the estimator, and by using the response signal resulting from that excitation signal as an input to the nonlinear frequency estimator. The output of the estimator identifies the optimal frequency for wireless power transfer under the existing conditions.

Figure 14A:
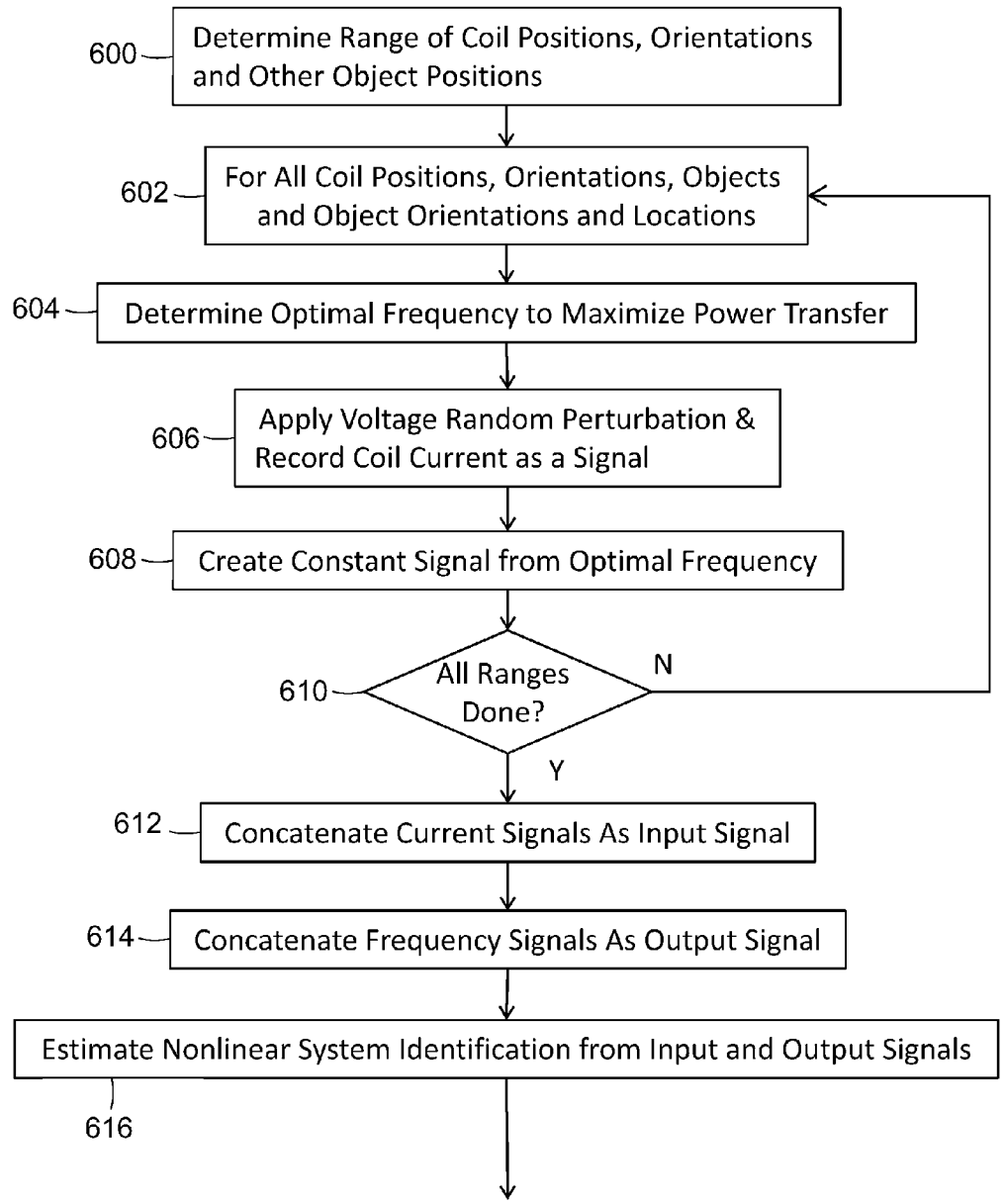
FIG. 14A presents a flow chart of an algorithm for creating a nonlinear filter for use by a transmitter power controller to auto-adjust the frequency of the wireless power transfer signal.
Figure 14B:
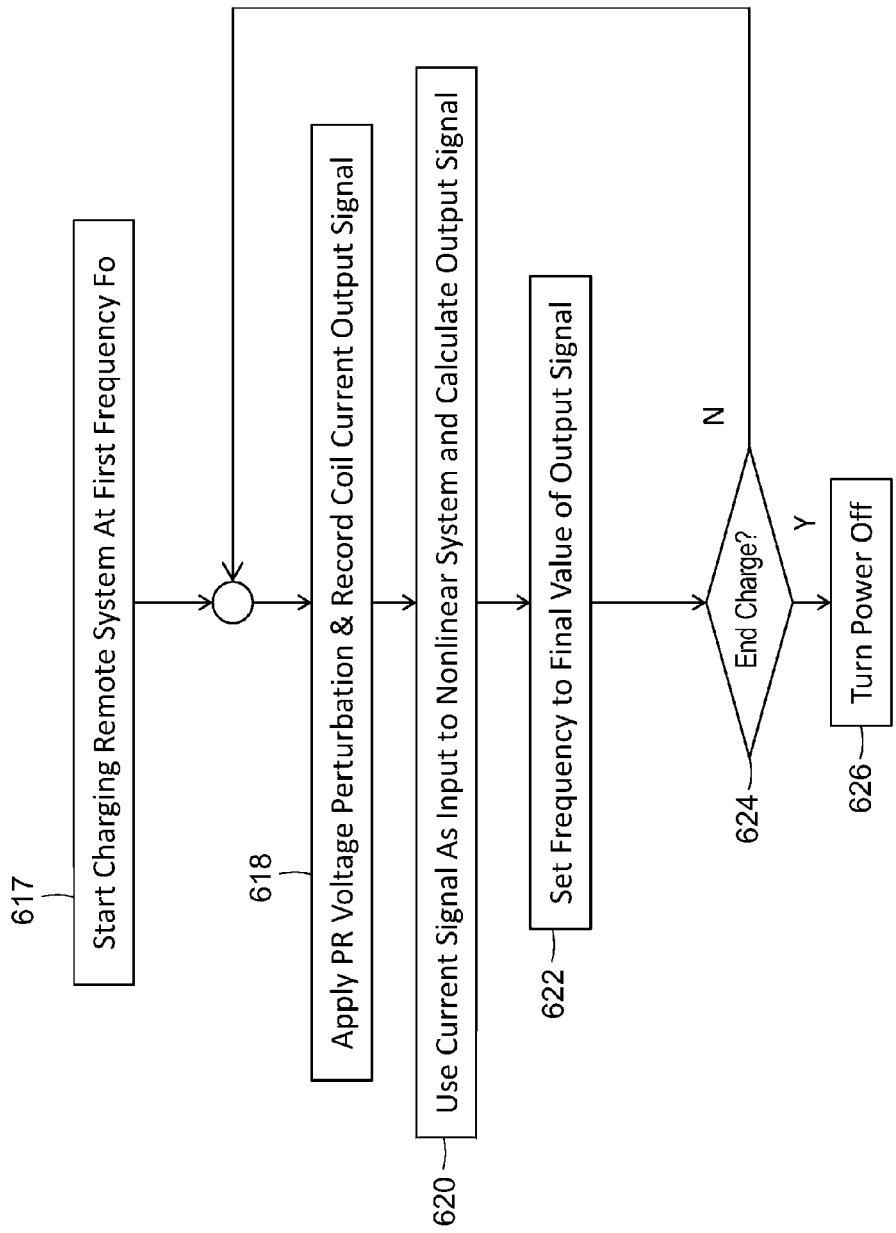
FIG. 14B presents a flow chart of an algorithm implemented by the transmitter power controller for using the nonlinear filter of FIG. 14A to auto-adjust the frequency of the wireless power transfer signal.

A more detailed illustration of this direct method is shown in FIGS. 14A and 14B. There is an offline part (FIG. 14A) and a real-time part (FIG. 14B). The offline part is conducted using equipment that is identical to the equipment with which the real-time part will be implemented. It is for the purpose of constructing a nonlinear model that can be used as the estimator.

Referring now to 14A, for the offline part, a determination is made of the range conditions to be modeled (600). The range of conditions reflects the different locations and orientations of the coils relative to each other for which auto-tuning will be performed in real-time. Experiments are to be carried out offline for each of these different conditions. Experiments can also be carried out with different objects that might be present in the energy field and that might affect the wireless power transfer. This could include, for example, shielding materials, such as metal sheets or metal tubing, at different distances from the coils. In other words, the objective would be to reproduce the real life conditions under which wireless power transfer is likely to be used. Once the range of possible conditions is defined, the offline process involves performing a sequence of tests for each of the different conditions (602).

First, an optimal coil frequency to maximize power transfer is determined (604). Since this is done offline, it can be done either numerically or experimentally. Then, a pseudo random voltage perturbation signal is applied to the transmit coil and the coil current for the voltage signal is measured and recorded (606). A constant frequency signal with a value equal to the corresponding optimum frequency is also defined and stored in association with the recorded current signal (608).

That sequence of steps is repeated for all of the conditions that are to be modeled (610).

Once the measurement data for all of the conditions has been acquired, input and output signals for a nonlinear model are constructed in a manner that is similar to what was previously described in connection with FIG. 11. The recorded current signals for all of the conditions are concatenated together to form an input signal (612). And all of the corresponding frequency signals are concatenated together to form an output signal (614). The concatenated input and output signals are then treated as the input and output signals of a nonlinear system and nonlinear system identification is used to obtain a nonlinear model, such as a parallel cascade of structured blocks, of that nonlinear system (616). The resulting nonlinear model, which represents the frequency estimator, will be used in real-time by the transmitter power controller to determine the optimum frequency for wireless power transfer.

The algorithm illustrated in FIG. 14B represents the sequence of steps that are executed by the transmitter power controller. The transmitter power controller applies the pseudo-random voltage signal to the transmit coil and records the current signal produced by the transmit coil (618). Then, it uses the recorded current signal as an input to the nonlinear frequency estimator that was computed offline (620). The final output of the estimator is the optimum frequency for conducting power transfer under the existing conditions. i.e., the existing position and orientation of the two coils with respect to each other. The controller sets the frequency of the power transfer circuit to that frequency (622). At this point it checks whether the charging is complete (624). If it is, the power is turned off and wireless power transfer is terminated or a flag is set which causes power transfer to terminate or not take place (626).

If charging is not complete, the controller repeats the just-described sequence of steps 618-624 to account for any possible changes in the position of the transmit coil relative to the receiver coil or other anticipated changes in conditions. In other words, the auto-tuning process runs continually throughout the wireless power transfer operation.

Note that the algorithm just described involved charging while the pseudo-random signal is being applied to the system. Another approach, which would reduce the noise in the output signal, would be to interleave the charging with the testing. In that case, the pseudo-random signal would be applied while no drive signal is being applied.

Adjusting the Transmitter Waveform for Optimal Transfer

In theory, voltage and current signals flowing through self-resonant coils are typically sinusoidal, given that the physics of oscillators is such that they filter out most other waveforms. However, it is found in practice that higher power transfer efficiency can sometimes be obtained by using a slightly different waveform. In view of the fact that modern electronics mostly uses digitally controlled switching systems to create power signals, and not analog oscillators, the electronics lends itself to creating almost any arbitrary waveform.

Adjusting the waveform becomes possible after a nonlinear model describing the wireless power transmission is obtained. With the nonlinear model in hand, it is possible to employ an existing nonlinear control algorithm to obtain an improved waveform. Given that no general solution exists, the system dynamics are linearized around a trajectory in the state-space. Iteratively, and using existing linear control theory, the optimal control waveform is re-calculated and the system is re-linearized around the new trajectory until convergence is achieved.

Figure 15:
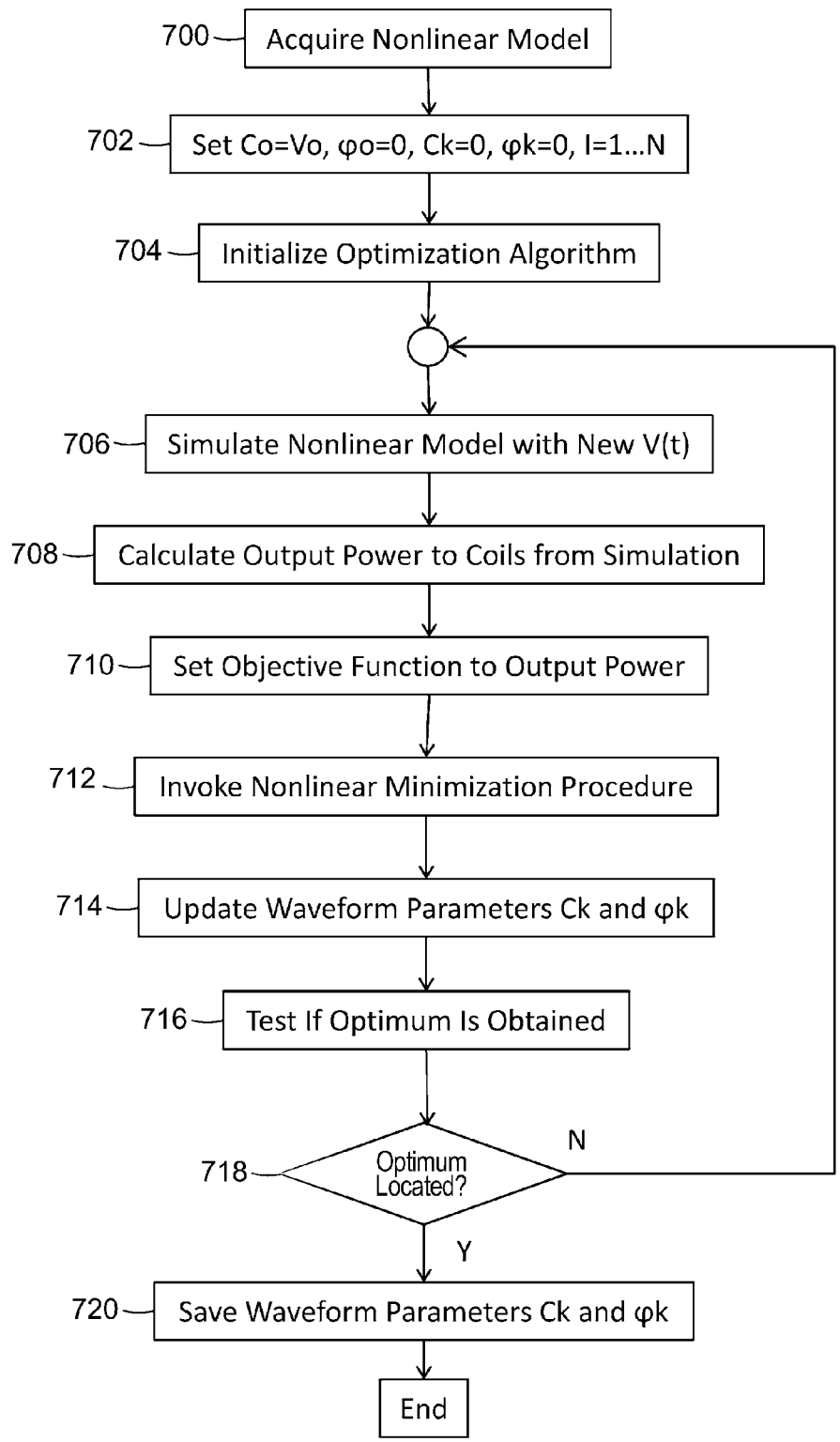
FIG. 15 presents a flow chart of an algorithm implemented at least in part by the transmitter power controller to adjust the waveform of the wireless power signal.

Alternatively, a numerical method can be used to calculate an optimal voltage waveform. Such a method is depicted in FIG. 15. In this flowchart the waveform is represented as finite series, such as a truncated Fourier series or sum of Chebychef polynomials. For a truncated Fourier series, the voltage can be represented as:

$$V(t) = \sum_{k=0}^{N} C_k * \cos(k * \omega_0 * t + \phi_k)$$

where $\omega_0$ is the fundamental angular frequency. For an optimum to exist, some constraints must be specified, either as bounds on V(t) or where the signal power $P_0$ is fixed and phase of the fundamental assumed to be zero:

$$P_0 = \sum_{k=0}^{N} C_k^2$$

$$\phi_0 = 0$$

A numerical optimization technique, such as a Levenberg-Marquardt optimization procedure with linear and nonlinear constraints, is then used to find the unknown parameters $C_k$ and $\phi_k$.

If it is found that the optimal waveform needs to be adjusted with the receiver coil position or as the receiver energy storage level changes, the same technique can be used iteratively in real time as the receiver moves.

FIG. 15 presents details of an exemplary algorithm for finding an optimal waveform for power transfer. In general, this procedure involves first acquiring a nonlinear model (700). Then, using that nonlinear model to simulate the power in the coil, an optimization technique is employed to locate the best waveform.

The nonlinear model for the transmitter and receiver system may be acquired as described previously. Although this can be done in real-time, when using pre-defined wireless charging systems it is generally not the case that the optimal waveform will vary significantly between different embodiments of the system. So, determining the optimal signal waveform can be done offline before the charging process After the nonlinear model has been acquired, the parameters for the finite series representation of the voltage waveform, which was discussed above, are initialized so that the waveform is a pure sinusoid (702). That is, $C_0$ is set to equal $V_0$, the amplitude of the applied voltage signal and the phase $\phi_0$ is set to zero, as are all of the other parameters, $C_k$ and $\phi_k$. In addition, the various parameters for the optimization algorithm that is be used are also initialized in preparation for beginning the optimization search (704).

Once initialization is complete, the processor system on which this is being run begins executing the optimization algorithm (706-718). This involves a sequence of steps that are repeated until it finds a set of parameter values, $C_k$ and $\phi_k$, which maximizes the objective function, namely, the output power of the transmit coil. The processor uses the acquired nonlinear model to simulate the current waveform that results from driving the system with the selected voltage waveform (706). It then computes the output power to the transmit coil and sets the objective function equal to that computed output power (708). Next, the processor invokes a known nonlinear minimization procedure to find a set of parameter values that maximizes the output power (712). During this search for the optimum waveform, the controller uses the nonlinear model to repeatedly simulate the current waveform, each time changing the values of the parameters, $C_k$ and $\phi_k$, for drive signal until an apparent optimum is found.

After finding the set of parameter values that maximizes the output power, the processor updates the voltage signal with those new parameters (714) and tests whether an optimum has been found (716). If it is determined that an optimum has not been found, the processor system branches back to the beginning of this optimization loop and repeats the calculations to find a better set of values (718).

Once the optimum set of values is found, the processor saves those values for use by the transmitter power controller (720).

If an adequate communication channel exists between the receiver and transmitter and it is possible to get the actual power signal going to the energy storage pack, the algorithm can be adapted to directly predict the stored power and then adjust the input waveform to optimize the stored power.

Detecting the Presence of Foreign Objects

The detection of foreign objects near the power coils is required both for safety and efficiencies. Given the relatively low frequencies used in transmitting power and given that power transmission is achieved by inductive coupling with little electromagnetic radiation generated by the coils, RIC is inherently safer than most other wireless power transmission methods, particularly those using microwaves or light.

Objects that do not interfere with the magnetic field would rarely be of any concern from a safety viewpoint or interference with the wireless charging system. If such objects need to be detected, other means, such as optical, mechanical, or acoustic methods have to be used.

Of greater concern are objects that are electrically conductive, such as pieces of metal, carbon fiber material, or even living tissue. If such an object is present, strong eddy currents could be generated causing transmission losses, local heating in the object, and potentially leading to degradation or even worse causing cell damage in humans. When hundreds of kilowatts are transmitted, Joule heating could elevate the temperature of foreign objects above 50° C. and result in skin burns. Upon reaching hundreds of kilowatts, exposure risks would exist for long exposure and possibly for people wearing pacemakers. So, it is important to detect when conductive objects, including living tissue, comes into proximity of the transmit coil.

Proximity sensors and optical techniques can be used. Methods have been proposed for detecting the presence of foreign objects based on models for determining unexpected power losses. See, for example, Kuyvenhoven, N., Dean, C., Melton, J., Schwannecke, J., and Umenei, A. E., "Development of a Foreign Object Detection and Analysis Method for Wireless Power Systems," IEEE, Wireless Power Consortium (2011). When the receiver coil sub-system can communicate with the transmitter sub-system, it can inform the transmitter of the amount of power received. The controller in the transmitter sub-system can calculate losses from the known amount of energy going to the coils. And if the amount of unaccounted power exceeds a predefined threshold, the power transmission would be interrupted.

However, detecting such objects directly from the modifications they cause in the fields sensed by coils is much more practical. As described herein, by continuously estimating the nonlinear dynamic response of the transmit coil, it is possible to detect a foreign object from the manner in which it alters the transmitter dynamics. Nonlinearities tend to occur primarily in the receiver electronics system. Nonlinearities are less likely to occur in metallic or other electrically conductive systems, such as biological tissues, which do not exhibit saturation.

In addition, typical electrical components react linearly in the presence of an electric field, and, in the frequency domain, the bode plots of their impedance are defined by straight lines with integer slopes in a log-log plot. Also, the phase is linearly related to the slope of the impedance versus frequency and they behave as minimal phase systems. In the case of living tissue, typically the slope is not an integral number and it does not respond as a minimal phase system. So, various foreign objects, particularly in the case of complex structures or large distributed masses, will primarily affect the linear part of a nonlinear system in a very characteristic way.

A detection system in the transmitter power controller can be trained with different types of materials so that it can detect, based on changes in the linear and nonlinear components of the coil system, that a foreign object has come into the neighborhood of the transmit coil. First, a large collection of nonlinear models is identified and stored in a database as representative of typical objects, metal or artificial tissues, to be detected. Subsequently, these models are classified using existing mathematical techniques such as neural networks, Principal Component Analysis (PCA), or SVD. PCA and SVD can be used to define an optimal basis to represent the models from which a highly reduced representation of the model space is obtained and used for detection.

Given that different objects affect the linear and/or nonlinear components of nonlinear models differently, their unique characteristics can be isolated in different components of the optimal basis functions. Therefore, if an object, such as human body, comes into the neighborhood of a wireless transmission system, its specific components will appear in the coefficients related to its particular basis functions and become detectable from the coefficient values. In such a case, it is sufficient to look at the coefficients characteristic of the human or animal modes to determine if a human or animal is in proximity to the coil. Alternatively, the space can be partitioned into regions that characterize each object of interest. Subsequently, when a model moves towards or outside the boundaries of its cluster space, it gives an indication of the presence of foreign objects.

Figure 16A:
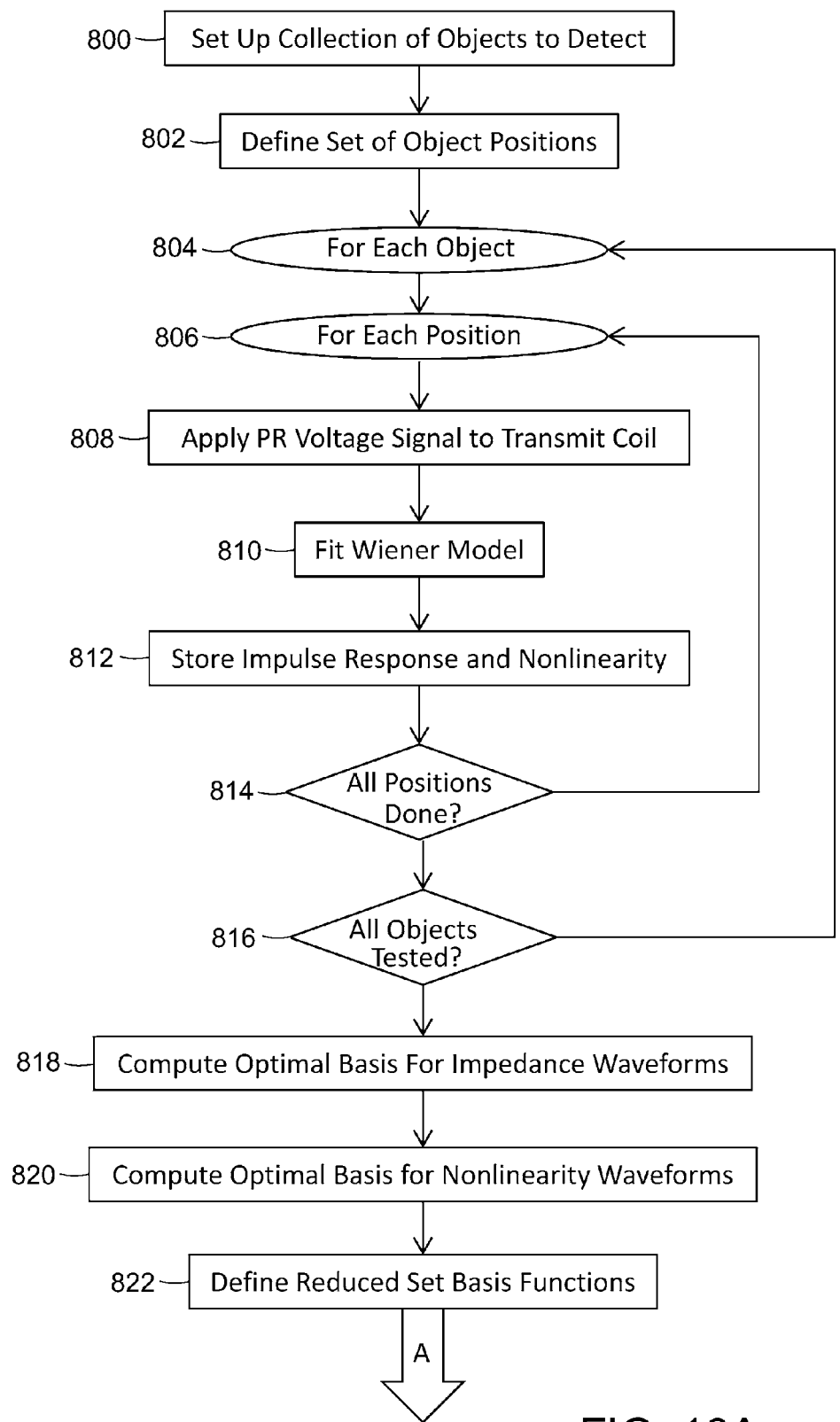
FIGS. 16A-B present a flow chart of an algorithm for pre-training the transmitter power controller of a wireless power transfer system for detecting foreign objects.
Figure 16B:
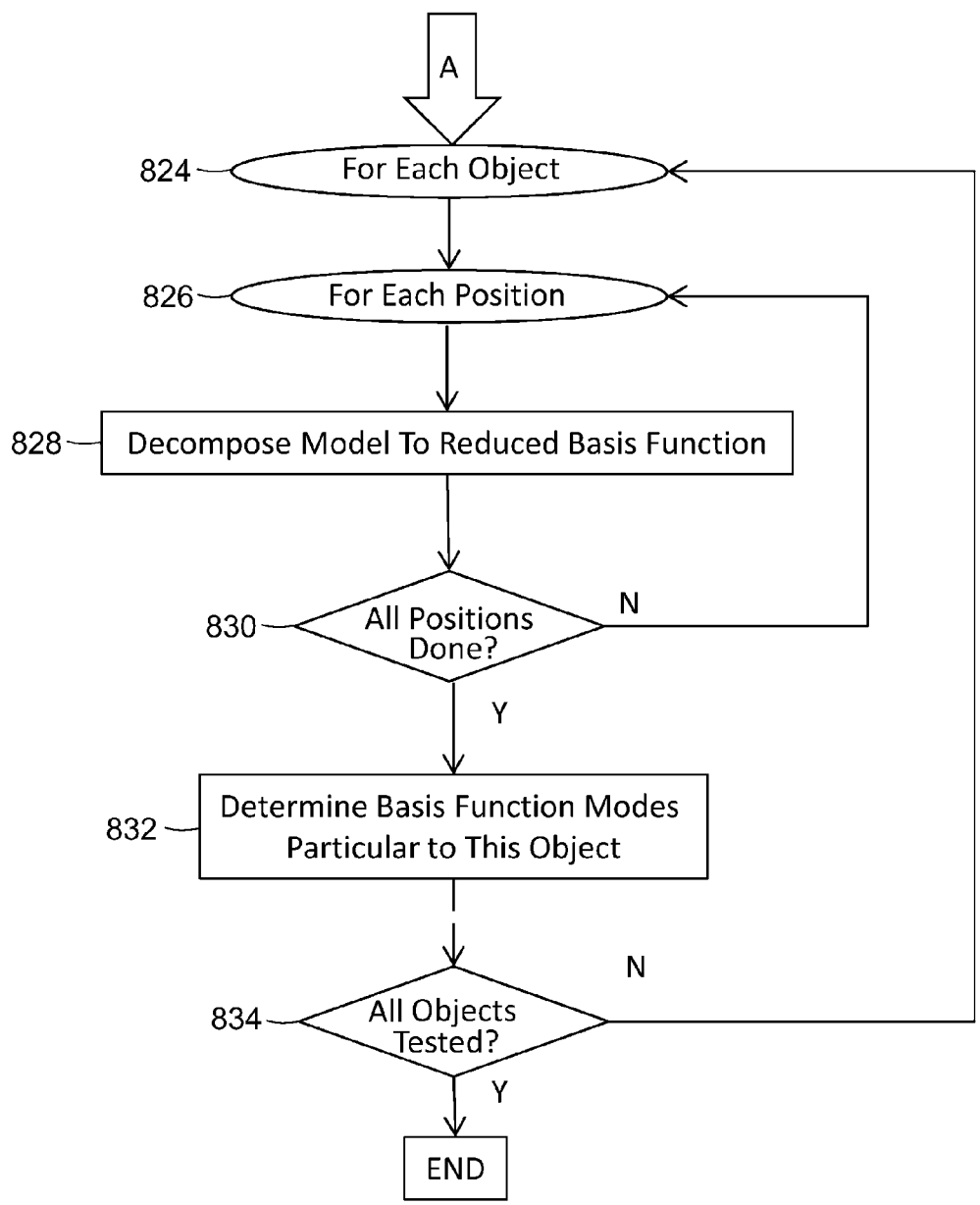

FIGS. 16A and 16B illustrate an implementation of a training algorithm for one such system. In general, nonlinear system identification is used to collect a large number of dynamic system models for different types of objects at different locations relative to the transmit coil. After data collection for those objects, optimal basis functions are derived using SVD decomposition. Subsequently, modes that are mostly representative of each type of object are isolated in the model space by locating which modes have significant components that are unique to that object type.

Figure 17:
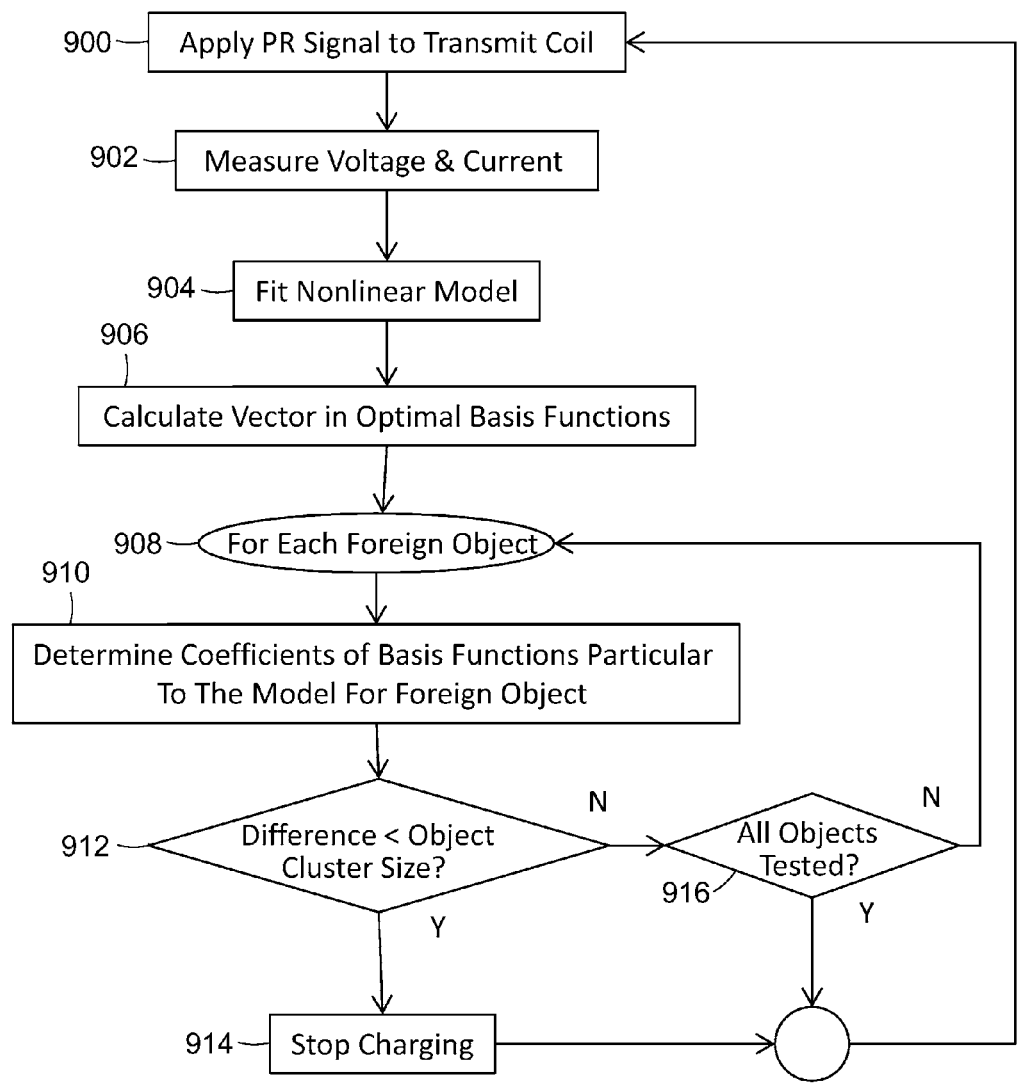
FIG. 17 presents a flow chart of an algorithm implemented by the transmitter power controller to detect foreign objects.

FIG. 17 indicates how the detection proceeds in the field using the information gathered from the training algorithm. In general, raw data is continuously acquired and nonlinear models continuously derived from that raw data. Each time a new model is acquired, it is decomposed into its optimal basis coefficients. Then, for each representative type of object of interest in the database, when corresponding mode coefficients exceed a predefined threshold, that signals the likely presence of that type of object and wireless power transfer is interrupted or a warning signal is issued.

A more detailed description of the embodiments illustrated by FIGS. 16A, 16B and 17 now follows.

Referring to FIG. 16A, constructing a database (or pre-training) for foreign object detection involves a set of steps that are similar to those performed for detecting the presence of a receiver, as illustrated by FIG. 9. It begins by identifying and assembling a collection of objects that one wishes to detect (800). So, for example, since it is desired that the charging process be terminated when a human or animal comes into the wireless power transfer field, objects representative of human and animal tissue need to be included in the collection of objects. Since it is also desirable to detect the presence of objects that either interfere with the wireless transfer of power and/or will be damaged or cause potential damage to people if present in the wireless power transfer field, those objects also need to be identified and added to the collection of objects.

Once the collection of objects has been identified, a set of positions for those objects relative to the transmit coil is defined (802). This is a representative set of positions at which it is desired to detect the presence of any of the objects in the power transfer field.

With the collection of objects identified and the set of positions defined, the training procedure involves performing experiments on each of the objects (804) at each of those positions (806) to derive a corresponding nonlinear model of the system. For a selected object located at one of the defined positions, a pseudo-random voltage signal (e.g. GWN signal) is applied to the transmit coil (808). While that pseudo-random signal is being applied to the transmit coil, the voltage signal and the current signal of the transmit coil is recorded and the recorded signals are fit to a Wiener model of the impedance of the transmit coil (810). The result is a linear part represented by an impulse response for the impedance and a nonlinear part represented by a nonlinearity waveform. Both the impulse response and the nonlinearity waveform are stored in association with the selected object and that selected position (812).

This process is repeated for each object (814) and at each of the defined positions (816) until all of the objects have been tested at all of the defined positions.

After collecting the data for each object at each of the defined positions, and using well-known techniques, an optimal basis for the collection of stored impedance waveforms is computed (818) and an optimal basis for the stored collection of nonlinearity waveforms is computed (820). This process employs an appropriate one of the well-known decomposition technique, such as SVD or PCA, etc. From the two optimal bases that have been computed, a reduced set of basis functions is identified (822).

Referring now to FIG. 16B, as part of the training procedure, another set of steps is executed for each object of the collection (824). For each position of an object selected from that collection of objects, the previously computed nonlinear model for that object at that position (826) is decomposed into the reduced basis functions that were identified during the first part of the training algorithm (828). When the processor system has performed this task for each position for which data was recorded for that object (830), it then determines the basis function modes that are particular to that object for that collection of models (832). In other words, it identifies the subset of basis functions that are most relevant to the computed set of data for that object. The coefficients of those basis functions define a point in the model space for the corresponding model. For the collection of such points for all the models for that object representing the different positions/orientations it is possible to use a well-known classification technique to define a region of that space that corresponds to the corresponding object.

The just-described process is performed for each of the objects in the collection until they have all been analyzed (834). The results define the regions of model space that correspond to the detected presence of a corresponding one of the foreign objects. It is the reduced set of basis functions along with the classification or cluster information that is stored in the transmitter power controller to be used during object detection. This data is stored in memory in the wireless power transmitter system for use by the detection algorithm.

Referring to FIG. 17, to perform object detection, the transmitter power controller applies a pseudo-random voltage signal (e.g. GWN) to the transmit coil (900) and it measures and records the voltage and current waveforms at the coil (902). Then, using nonlinear system identification as previously described, the controller fits a nonlinear dynamic system model for the coil (e.g. impedance) to the data for the recorded waveforms (904). Next, using the reduced set of basis functions identified during the training phase, the controller decomposes the waveforms obtained for the nonlinear model into those basis functions to obtain a vector representing the set of coefficients for the basis functions (906).

For a selected foreign object represented in its database (908), the controller then determines the coefficients of the basis functions that were determined during training to be particular to that object (910). Using those coefficients, it then determines where that vector falls in the model space with respect to the region that had been previously determined through classification methods to represent the foreign object (912). If it is determined that the set of coefficients defines a point in the model space that is within or close enough to the region (e.g. object size cluster), then it is concluded that a nearby foreign object has been detected and the controller sets a flag thereby causing the charging to terminate and/or not take place (914).

If it is determined that the object has not been detected, the controller clears any flag that might have been set to interrupt charging and moves on to test for the next object in its database (916). This process is repeated for each object in the database until all have been tested for (916).

After tests have been run for all objects in the database, the controller branches back to the beginning, applies another pseudo-random signal to the transmit coil, and conducts a new search for the presence of any foreign objects.

Figure 18A:
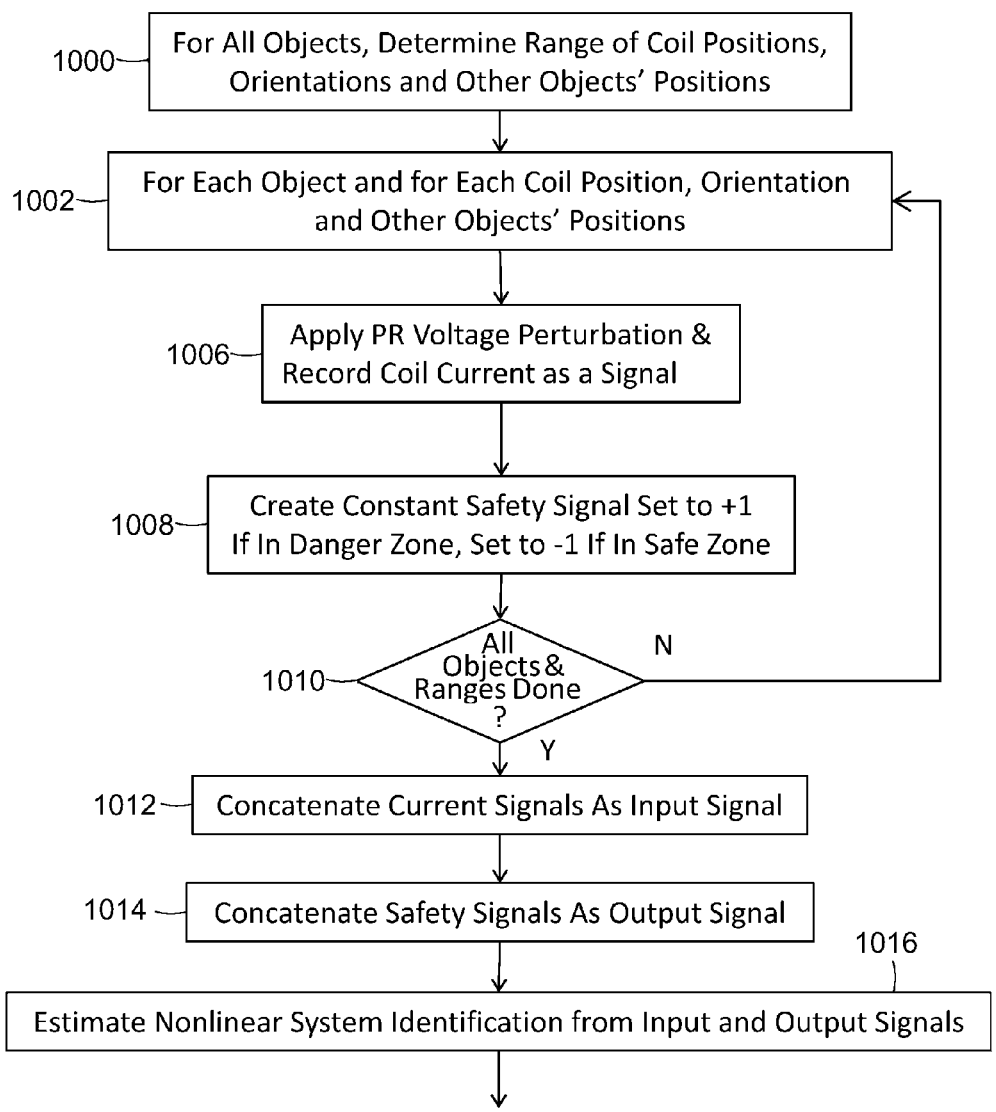
FIG. 18A presents a flow chart of an algorithm for creating a nonlinear filter for use by a transmitter power controller to detect the presence of a foreign object.
Figure 18B:
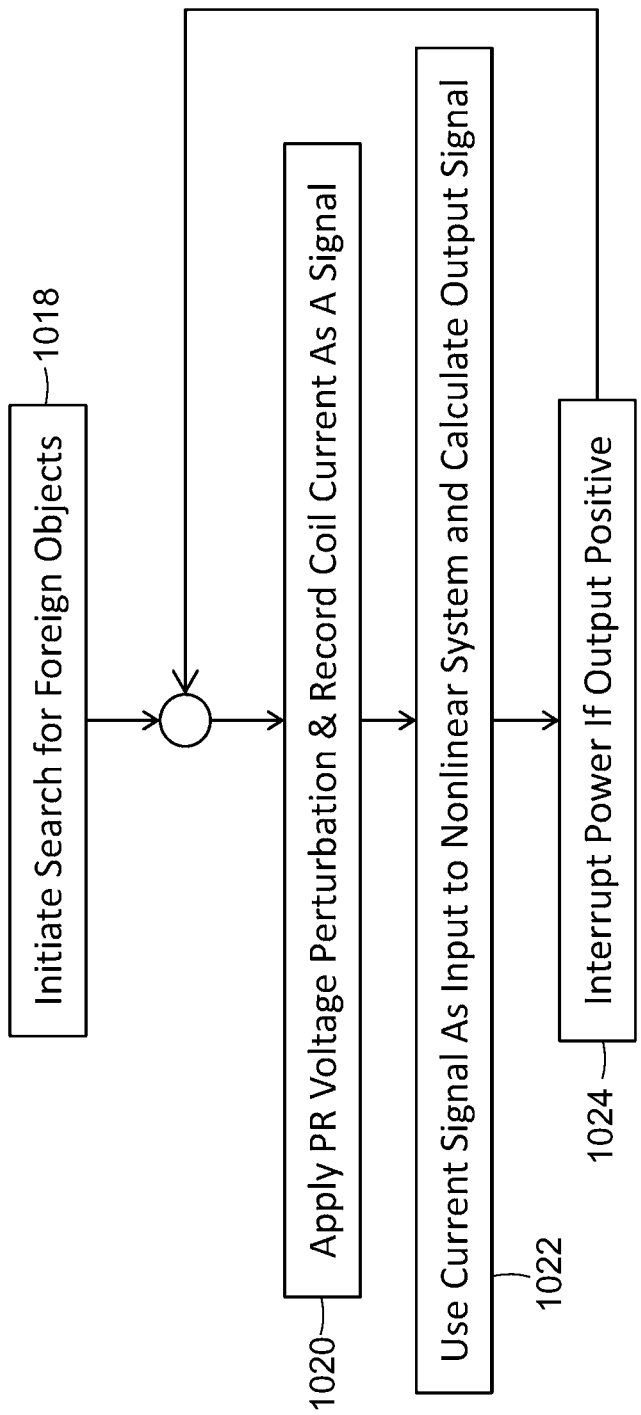
FIG. 18B presents a flow chart of an algorithm implemented by the transmitter power controller for using the nonlinear filter of FIG. 18A to detect the presence of a foreign object.

A more direct and computationally more efficient alternative method is shown in FIGS. 18A and 18B. It employs the Green approach such as was described in connection with the auto-tuning algorithm depicted in FIGS. 14A and 14B. The details are as follows.

As previously described, the process begins by identifying and assembling a collection of objects of a particular class that one wishes to detect (1000). In addition, for each object in the collection, all positions that are to be tested are defined, as are the identity and positions of any other objects that one might expect to find in the neighborhood of that object. One important classifier might be anything like biological tissue in the vicinity of the power coil. Another classifier might be the presence of metal where eddy currents are induced and result in power losses. The embodiment of FIGS. 18A-B illustrates a process for detecting biological tissue.

In general, to assemble a nonlinear model for detecting biological tissues, the various types and masses of biological tissue are placed at different locations relative to the transmit coil and measurements are made. More specifically, for each object and each position (1002), the following steps are performed. A pseudo-random voltage perturbation signal is applied to the transmit coil and, while doing so, the resulting current at the transmit coil is measured and recorded (1006). In addition, a safety signal is created for that object/position indicating whether the field is considered to be hazardous or produce an unsafe condition (1008). This can be determined empirically during this phase by using, for example, calibrated pickup coils. If it is felt that the object is in a danger zone (i.e., possible deleterious affects or unsafe conditions will result from being at that location), the value of the safety signal is set to a constant value (e.g. −1). Whereas, if it is felt that the object is in a safe zone (i.e., no deleterious affects or unsafe conditions will result from being at that location), the value of the safety signal is set to a different constant value (e.g. +1). This sequence of steps is repeated until it has been completed for all objects at all defined positions (1010).

After all the data has been collected, all of the recorded current signals are concatenated together to create an input signal (1012) to be used for system identification purposes and all of the safety signals are concatenated together in a similar manner to create a corresponding output signal (1014). Then, nonlinear system identification is used to derive a nonlinear model for a system characterized by those input and output signals. The resulting nonlinear model is used by the power transmitter controller as a nonlinear filter that outputs a signal indicting whether a foreign object is present.

The operation of the power transmitter controller is shown in FIG. 18B. Subsequently, in the unknown environment, the power transmitter controller initiates a search for foreign objects (1018). This involves applying a pseudo-random voltage signal to the transmit coil (the same as was used to build the database of information about foreign objects), and measuring and recording the current waveform (1020). The recorded current waveform is processed by the previously derived nonlinear system (1022). An output having a positive value indicates the possible presence of a foreign object (e.g. living tissue) and the power controller generates an interrupt signal that causes the power to the transmit coil to be interrupted (1024). And the controller repeats the search loop to determine when the foreign object is no longer present If the nonlinear filter outputs a negative value, indicating that no foreign object was found, any previously established interruption signal is cleared and the search loop is repeated.

The two specific examples of pseudo-random signals mentioned above were Gaussian White Noise (GWN) and Pseudo-Random Binary Sequences (PRBS). That is, however, not meant to be limiting. The reference to pseudo-random is also meant to include, for example, noise-like signals in which power may be concentrated so as to excite certain modes in the target system. In addition, it is meant to cover any signal that can be used to derive an impulse response or a transfer function for the stimulated system.

Other embodiments are within the scope of the following claims. For example, there are a number of "spaces" used to represent linear dynamic systems parametrically: state-space methods; transfer functions; frequency functions; difference equations in the form of ARX, ARMA, ARMAX models; Z-domain polynomials; and time domain methods where the impulse response is represented as a parametric function of time. There are methods to map representations between one space to another space, such as transfer functions to state-space representation. In the embodiments described above, time domain and frequency domain representations were explicitly mentioned. However, that was not intended to be limiting. The use of any one of the alternative representations is intended to fall within the scope of the invention.

In the above-described embodiments the dynamic system representations that were modeled were the transmit coil impedance and the transmit coil current. One could, of course, model other dynamic systems representations including, for example, power transferred, power loss, and power efficiency. For some representations, it would be necessary to obtain information from the receiver through another channel. For example, power loss or power efficiency requires being able to monitor the power that is supplied to the battery module; and thus would require relying on the receiver system to supply that information.

Although the above-described embodiments made specific reference to a vehicle platform, it is not intended that the use of the inventions described herein be limited to only that platform. The inventions described herein have applicability to any wireless power transfer system in which a wireless power transmitter and a receiver system might be brought into proximity of each other for the purpose of transferring power from one system to the other.

In the case of the detection algorithms, it was indicated that the transmit coil was used to detect the presence of a receiver coil or a foreign object. That need not be the case. One could instead use an additional, separate coil dedicated to use by the detection function.

It should be further noted that the algorithms presented herein need not be run only on a single processor, as might appear to have been implied. Multiple processors could be used with the tasks divided among them in an appropriate way. For example, in the case of the algorithm depicted in FIG. 9, it might be considered appropriate to perform all of the data collection on one processor and to perform the nonlinear system identification of another processor.

What is claimed is:

1. A method of detecting whether a receiver coil is near a transmit coil in a wireless power transfer system (WPTS), said method comprising:
    applying a pseudo-random signal to the transmit coil;
    while the pseudo-random signal is being applied to the transmit coil, recording one or more signals produced within the WPTS in response to the applied pseudo-random signal;
    by using the one or more recorded signals, generating a system model for some aspect of the WPTS; and
    using the generated system model in combination with stored training data to determine whether an object having characteristics distinguishing the object as a receiver coil is near the transmit coil.

2. The method of claim 1, wherein the system model for some aspect of the WPTS is a dynamic system model for some aspect of the WPTS.

3. The method of claim 2, further comprising, if the receiver coil is determined to be near the transmit coil, initiating a wireless power transfer through the transmit coil to the receiver coil.

4. The method of claim 2, wherein the pseudo-random signal is a pseudo-random voltage signal.

5. The method of claim 4, wherein the one or more signals includes a current signal of the transmit coil.

6. The method of claim 5, wherein the dynamic system model is an impedance function for the transmit coil.

7. The method of claim 4, wherein the one or more signals includes a current signal and a voltage signal of the transmit coil.

8. The method of claim 7, wherein the dynamic system model is a transmitted power function for transmit coil.

9. The method of claim 2, wherein the pseudo-random signal is sufficiently strong to stimulate nonlinearities in electrical characteristics of a receiver system connected to the receiver coil.

10. The method of claim 2, wherein using the generated dynamic system model comprises comparing information contained in the generated dynamic system model to empirically-derived, stored information that is indicative of a nearby presence of a receiver coil.

11. The method of claim 2, wherein generating the dynamic system model comprises using system identification to fit a selected model to data derived from the one or more recorded signals.

12. The method of claim 2, wherein generating the dynamic system model comprises using nonlinear system identification to fit a selected model to the data derived from the one or more recorded signals.

13. The method of claim 12, wherein the selected model is a Wiener system.

14. The method of claim 12, wherein the selected model is a Hammerstein system.

15. The method of claim 12, wherein the selected model is a parallel cascade of structures blocks.

16. The method of claim 12, wherein the selected model is a Volterra series.

17. The method of claim 12, wherein the selected model is a parametric linear model.

18. The method of claim 12, wherein the selected model has a dynamic linear part and a static nonlinear part.

19. The method of claim 12, wherein the generated dynamic system model comprises a time domain representation.

20. The method of claim 12, wherein the generated dynamic system model comprises a frequency domain representation.

21. The method of claim 2, wherein using the generated dynamic system model comprises decomposing the dynamic system model into basis functions to generate a set of basis function parameters.

22. The method of claim 21, wherein using the generated dynamic system model further comprises using the set of basis function parameters to determine whether a receiver coil is near the transmit coil.

23. The method of claim 2, wherein the pseudo-random signal is a selected one of a Gaussian White Noise signal and a Pseudo-Random Binary Sequence (PRBS).

24. The method of claim 2, wherein the stored training data is represented by a stored filter function and wherein using the generated dynamic system model in combination with stored training data comprises processing the generated dynamic system model to generate an output signal, wherein the output signal indicates whether an object having characteristics recognizable from the stored training data as a receiver coil is near the transmit coil and wherein processing the dynamic system model comprises applying the stored filter function.

25. The method of claim 24, wherein the one or more recorded signals includes a current signal of the transmit coil.

26. The method of claim 24, wherein the generated dynamic system model is the measured current signal.

27. The method of claim 24, wherein the filter function is a nonlinear filter function.

28. The method of claim 27, wherein the nonlinear filter function was derived from measurements made on a test system including a test transmit coil and a test receiver coil located at different distances of separation from each other.

29. The method of claim 24, further comprising, if a receiver coil is detected near the transmit coil, initiating a wireless power transfer through the transmit coil to the detected receiver coil.

30. A wireless power transfer system comprising:
a transmit coil;
a power transmitter circuit connected to the transmit coil;
a sensor circuit connected to the transmit coil; and
a controller for controlling the power transmitter circuit and the sensor circuit, wherein said controller includes a memory for storing training data and a processor system programmed to:
cause the power transmitter circuit to apply a pseudo-random signal to the transmit coil;
while the pseudo-random signal is being applied to the transmit coil, cause the sensor circuit to record one or more signals produced within the WPTS in response to the applied pseudo-random signal;
by using the one or more recorded signals, generate a system model for some aspect of the WPTS; and
use the generated system model in combination with the stored training data to determine whether an object having characteristics distinguishing the object as a receiver coil is near the transmit coil.

31. The wireless power transfer system of claim 30, wherein the system model for some aspect of the WPTS is a dynamic system model for some aspect of the WPTS.

32. The wireless power transfer system of claim 31, wherein the one or more signals includes a current signal and a voltage signal of the transmit coil.

33. The wireless power transfer system of claim 31, wherein the stored training data is represented by a stored filter function and wherein the processor system is programmed to use the generated dynamic system model in combination with stored training data by processing the generated dynamic system model with the filter function to generate an output signal, wherein the output signal indicates whether an object having characteristics recognizable from the stored training data as a receiver coil is near the transmit coil.

34. The wireless power transfer system of claim 33, wherein the one or more recorded signals includes a current signal of the transmit coil.

35. The wireless power transfer system of claim 33, wherein the generated dynamic system model is the measured current signal.

* * * * *